United States Patent
Chen et al.

(10) Patent No.: US 10,385,838 B2
(45) Date of Patent: *Aug. 20, 2019

(54) MINIATURE FLUID CONTROL DEVICE

(71) Applicant: MICROJET TECHNOLOGY CO., LTD., Hsinchu (TW)

(72) Inventors: Shih-Chang Chen, Hsinchu (TW); Chi-Feng Huang, Hsinchu (TW); Yung-Lung Han, Hsinchu (TW); Jia-Yu Liao, Hsinchu (TW); Shou-Hung Chen, Hsinchu (TW); Che-Wei Huang, Hsinchu (TW); Hung-Hsin Liao, Hsinchu (TW); Chao-Chih Chen, Hsinchu (TW); Jheng-Wei Chen, Hsinchu (TW); Ying-Lun Chang, Hsinchu (TW); Chia-Hao Chang, Hsinchu (TW); Wei-Ming Lee, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 60 days.

This patent is subject to a terminal disclaimer.

(21) Appl. No.: 15/409,847

(22) Filed: Jan. 19, 2017

(65) Prior Publication Data
US 2017/0218941 A1     Aug. 3, 2017

(30) Foreign Application Priority Data

Jan. 29, 2016  (TW) .............................. 105102842 A
Jan. 29, 2016  (TW) .............................. 105102843 A
(Continued)

(51) Int. Cl.
*F04B 43/04*     (2006.01)
*F04B 45/047*    (2006.01)
(Continued)

(52) U.S. Cl.
CPC .......... *F04B 43/046* (2013.01); *F04B 45/047* (2013.01); *F04B 53/10* (2013.01); *H01L 41/053* (2013.01); *H01L 41/09* (2013.01)

(58) Field of Classification Search
CPC ........ F04B 45/047; F04B 45/04; F04B 43/04; F04B 43/046; F04B 43/095; F16K 99/0048; H01L 41/053
See application file for complete search history.

(56) References Cited

U.S. PATENT DOCUMENTS

| 4,594,059 A | 6/1986 | Becker |
| 5,079,472 A | 1/1992 | Uhl et al. |

(Continued)

FOREIGN PATENT DOCUMENTS

| CN | 102046978 | 5/2011 |
| CN | 102057163 | 5/2011 |

(Continued)

OTHER PUBLICATIONS

U.S. Office Action for U.S. Appl. No. 15/392,036, dated Mar. 29, 2019.

(Continued)

*Primary Examiner* — Kenneth J Hansen
(74) *Attorney, Agent, or Firm* — Birch, Stewart, Kolasch & Birch, LLP

(57) ABSTRACT

A miniature fluid control device includes a gas inlet plate, a resonance plate and a piezoelectric actuator. The gas inlet plate includes at least one inlet, at least one convergence channel and a central cavity. A convergence chamber is defined by the central cavity. The resonance plate has a central aperture. The piezoelectric actuator includes a suspension plate, an outer frame and a piezoelectric ceramic plate. A gap is formed between the resonance plate and the piezoelectric actuator to define a first chamber. When the (Continued)

piezoelectric actuator is driven and after the gas is fed into the miniature fluid control device through the inlet of the gas inlet plate, the gas is sequentially converged to the central cavity through the convergence channel, transferred through the central aperture of the resonance plate, introduced into the first chamber, transferred downwardly through the piezoelectric actuator, and exited from the miniature fluid control device.

20 Claims, 14 Drawing Sheets

(30) Foreign Application Priority Data

| Jan. 29, 2016 | (TW) | 105102845 A |
|---|---|---|
| Jun. 24, 2016 | (TW) | 105119823 A |
| Jun. 24, 2016 | (TW) | 105119824 A |
| Jun. 24, 2016 | (TW) | 105119825 A |
| Sep. 5, 2016 | (TW) | 105128569 A |

(51) Int. Cl.
*F04B 53/10* (2006.01)
*H01L 41/053* (2006.01)
*H01L 41/09* (2006.01)

(56) References Cited

U.S. PATENT DOCUMENTS

| 5,171,132 | A | 12/1992 | Miyazaki et al. |
|---|---|---|---|
| 5,834,864 | A | 11/1998 | Hesterman |
| 6,261,066 | B1 | 7/2001 | Linnemann et al. |
| 6,481,984 | B1 | 11/2002 | Shinohara et al. |
| 6,715,733 | B2 | 4/2004 | Wang et al. |
| 8,596,998 | B2 | 12/2013 | Fujisaki et al. |
| 9,028,226 | B2 | 5/2015 | Hirata et al. |
| 2002/0186860 | A1 | 12/2002 | Ogura et al. |
| 2003/0143122 | A1* | 7/2003 | Sander ............ B01L 3/0268 422/503 |
| 2005/0104941 | A1 | 5/2005 | Tanaka |
| 2006/0159295 | A1 | 7/2006 | Onishi et al. |
| 2009/0085441 | A1 | 4/2009 | Morris et al. |
| 2009/0232683 | A1 | 9/2009 | Hirata et al. |
| 2009/0242060 | A1* | 10/2009 | Chen ............ F04B 43/043 137/814 |
| 2009/0261688 | A1 | 10/2009 | Xie et al. |
| 2011/0076170 | A1* | 3/2011 | Fujisaki ............ F04B 45/047 417/415 |
| 2012/0171062 | A1 | 7/2012 | Kodama et al. |
| 2013/0223979 | A1 | 8/2013 | Locke et al. |
| 2013/0323085 | A1 | 12/2013 | Hirata et al. |
| 2014/0346928 | A1 | 11/2014 | Jun |
| 2014/0377099 | A1* | 12/2014 | Hsueh ............ F04B 43/046 417/413.2 |
| 2015/0071797 | A1 | 3/2015 | Takeuchi |
| 2015/0114222 | A1 | 4/2015 | Murakami |
| 2016/0076530 | A1 | 3/2016 | Chen |
| 2018/0066768 | A1 | 3/2018 | Han et al. |

FOREIGN PATENT DOCUMENTS

| CN | 102444566 | | 5/2012 |
|---|---|---|---|
| CN | 102979706 | | 3/2013 |
| CN | 103140674 | | 6/2013 |
| CN | 203476669 | | 3/2014 |
| CN | 203476838 | | 3/2014 |
| CN | 203488347 | U | 3/2014 |
| CN | 104234986 | | 12/2014 |
| CN | 104235081 | A | 12/2014 |
| CN | 104246228 | | 12/2014 |
| CN | 104302913 | | 1/2015 |
| CN | 205383064 | U | 7/2016 |
| EP | 2557312 | | 2/2013 |
| EP | 3203079 | A1 | 8/2017 |
| JP | 58-104379 | A | 6/1983 |
| JP | 7-122966 | A | 5/1995 |
| JP | 2004328055 | A | 11/2004 |
| JP | 2005299597 | A | 10/2005 |
| JP | 2006522896 | A | 10/2006 |
| JP | 2009-57963 | A | 3/2009 |
| JP | 2009131740 | A | 6/2009 |
| JP | 2009-156454 | A | 7/2009 |
| JP | 2009293566 | A | 12/2009 |
| JP | 2010214633 | A | 9/2010 |
| JP | WO2011/145544 | A1 | 11/2011 |
| JP | 2012-151651 | A | 8/2012 |
| JP | 2013050108 | | 3/2013 |
| JP | 2013057247 | A | 3/2013 |
| JP | 2013-119877 | A | 6/2013 |
| JP | 2013117211 | A | 6/2013 |
| JP | 2013245649 | A | 12/2013 |
| JP | 5692465 | B2 | 4/2015 |
| JP | 2017-133507 | A | 8/2017 |
| JP | 2017-133510 | A | 8/2017 |
| TW | 200303845 | A | 9/2003 |
| TW | 561223 | | 11/2003 |
| TW | 200938730 | | 9/2009 |
| TW | M465471 | | 11/2013 |
| TW | M467740 | | 12/2013 |
| TW | M481312 | | 7/2014 |
| TW | 201500151 | | 1/2015 |
| TW | 201501807 | | 1/2015 |
| TW | M513272 | | 12/2015 |
| TW | M528306 | U | 9/2016 |
| TW | M529794 | U | 10/2016 |
| TW | M530883 | U | 10/2016 |
| TW | M535746 | | 1/2017 |
| WO | 2009145064 | A | 12/2009 |
| WO | 2013187271 | | 12/2013 |
| WO | 2015087086 | A1 | 6/2015 |
| WO | WO 2016/013390 | A1 | 1/2016 |

OTHER PUBLICATIONS

U.S. Office Action for U.S. Appl. No. 15/392,061 dated Mar. 25, 2019.

U.S. Office Action for U.S. Appl. No. 15/409,960 dated Apr. 3, 2019.

U.S. Office Action for U.S. Appl. No. 15/414,816 dated May 8, 2019.

U.S. Office Action dated Jun. 3, 2019 for U.S. Appl. No. 15/808,021.

\* cited by examiner

MINIATURE FLUID CONTROL DEVICE

FIELD OF THE INVENTION

The present invention relates to a fluid control device, and more particularly to a slim and silent miniature fluid control device for a miniature pneumatic device.

BACKGROUND OF THE INVENTION

With the advancement of science and technology, fluid transportation devices used in many sectors such as pharmaceutical industries, computer techniques, printing industries or energy industries are developed toward elaboration and miniaturization. The fluid transportation devices are important components that are used in for example micro pumps, micro atomizers, printheads or industrial printers. Therefore, it is important to provide an improved structure of the fluid transportation device.

For example, in the pharmaceutical industries, pneumatic devices or pneumatic machines use motors or pressure valves to transfer gases. However, due to the volume limitations of the motors and the pressure valves, the pneumatic devices or the pneumatic machines are bulky in volume. In other words, the conventional pneumatic device fails to meet the miniaturization requirement, can't be installed in or cooperated with a portable equipment, and is not portable. Moreover, during operations of the motor or the pressure valve, annoying noise is readily generated. That is, the conventional pneumatic device is neither friendly nor comfortable to the user.

Therefore, there is a need of providing a miniature fluid control device for a miniature pneumatic device with small, miniature, silent, portable and comfortable benefits in order to eliminate the above drawbacks.

SUMMARY OF THE INVENTION

The present invention provides a miniature fluid control device for a portable or wearable equipment or machine. When a piezoelectric ceramic plate is operated at a high frequency, a pressure gradient is generated in the fluid channels of a miniature fluid control device to facilitate the gas to flow at a high speed. Moreover, since there is an impedance difference between the feeding direction and the exiting direction, the gas can be transmitted from the inlet side to the outlet side. Consequently, the miniature fluid control device for a miniature pneumatic device is small, slim, portable and silent.

In accordance with an aspect of the present invention, a miniature fluid control device for a miniature pneumatic device is provided. The miniature fluid control device includes a gas inlet plate, a resonance plate and a piezoelectric actuator. The gas inlet plate includes at least one inlet, at least one convergence channel and a central cavity. A convergence chamber is defined by the central cavity. After a gas is introduced into the at least one convergence channel through the at least one inlet, the gas is guided by the at least one convergence channel and converged to the convergence chamber. The resonance plate has a central aperture corresponding to the convergence chamber of the gas inlet plate. The piezoelectric actuator includes a suspension plate, an outer frame and a piezoelectric ceramic plate. A length of the suspension plate is in a range between 4 mm and 8 mm, a width of the suspension plate is in a range between 4 mm and 8 mm, and a thickness of the suspension plate is in a range between 0.1 mm and 0.4 mm. The suspension plate and the outer frame are connected with each other through at least one bracket. The piezoelectric ceramic plate is attached on a first surface of the suspension plate. A length of the piezoelectric ceramic plate is not larger than a length of the suspension plate, the length of the piezoelectric ceramic plate is in a range between 4 mm and 8 mm, a width of the piezoelectric ceramic plate is in a range between 4 mm and 8 mm, a thickness of the piezoelectric ceramic plate is in a range between 0.05 mm and 0.3 mm, and a length/width ratio of the piezoelectric ceramic plate is in a range between 0.5 and 2. The gas inlet plate, the resonance plate and the piezoelectric actuator are stacked on each other sequentially. A gap is formed between the resonance plate and the piezoelectric actuator to define a first chamber. When the piezoelectric actuator is driven and after the gas is fed into the miniature fluid control device through the at least one inlet of the gas inlet plate, the gas is sequentially converged to the central cavity through the at least one convergence channel, transferred through the central aperture of the resonance plate, introduced into the first chamber, transferred downwardly through a vacant space between the at least one bracket of the piezoelectric actuator, and exited from the miniature fluid control device.

In accordance with another aspect of the present invention, a miniature fluid control device for a miniature pneumatic device is provided. The miniature fluid control device includes a gas inlet plate, a resonance plate and a piezoelectric actuator. The gas inlet plate, the resonance plate and the piezoelectric actuator are stacked on each other sequentially. The piezoelectric actuator comprises a suspension plate, wherein a length of the suspension plate is in a range between 4 mm and 8 mm, a width of the suspension plate is in a range between 4 mm and 8 mm, and a thickness of the suspension plate is in a range between 0.1 mm and 0.4 mm. A gap is formed between the resonance plate and the piezoelectric actuator to define a first chamber. When the piezoelectric actuator is driven and after the gas is fed into the miniature fluid control device through the gas inlet plate, the gas is transferred through the resonance plate, introduced into the first chamber, and exited from the miniature fluid control device.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a miniature pneumatic device. The miniature pneumatic device may be used in many sectors such as pharmaceutical industries, energy industries, computer techniques or printing industries for transporting gases.

Figure 1A:
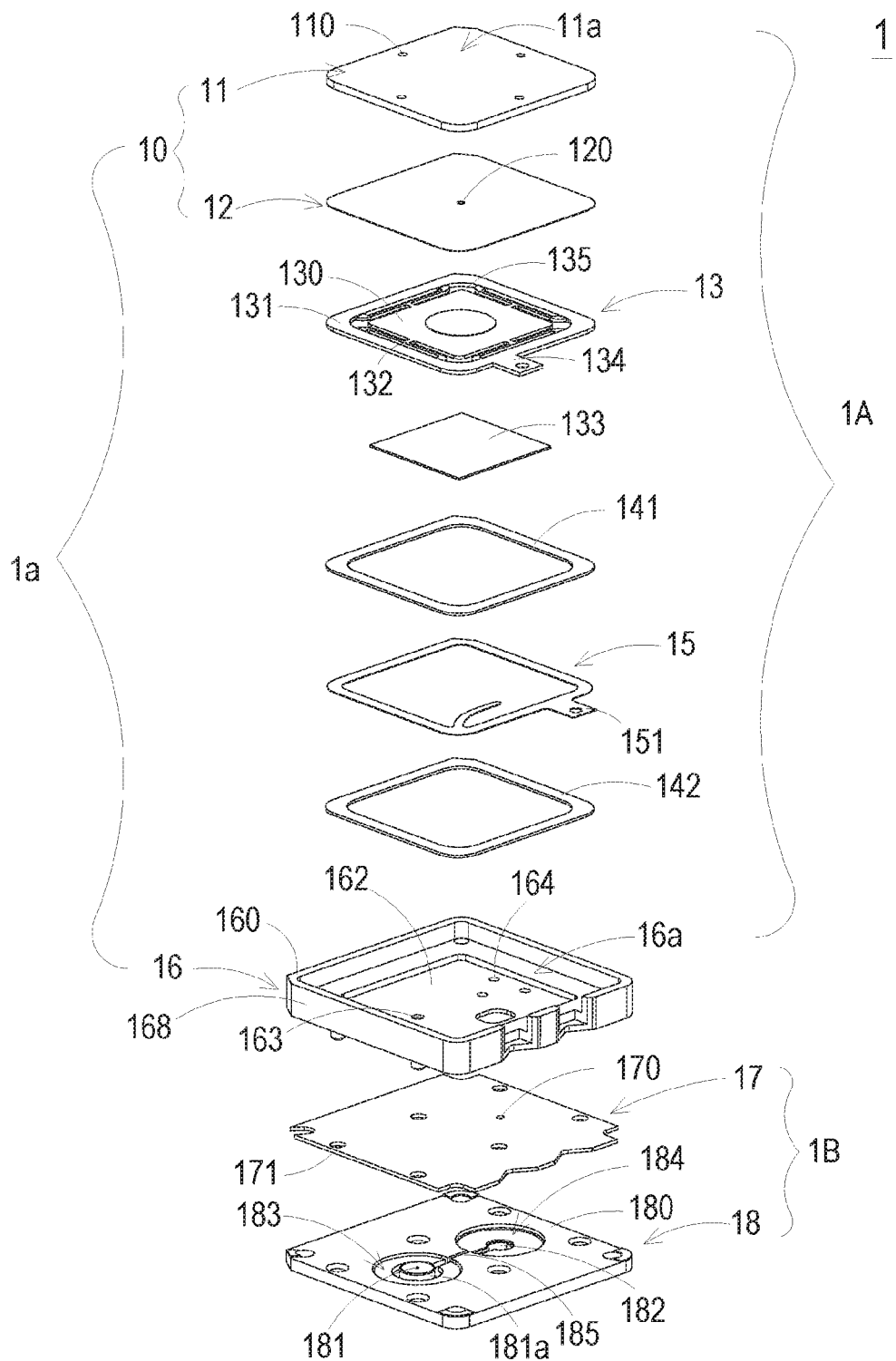
FIG. 1A is a schematic exploded view illustrating a miniature pneumatic device according to an embodiment of the present invention and taken along a first viewpoint.
Figure 1B:
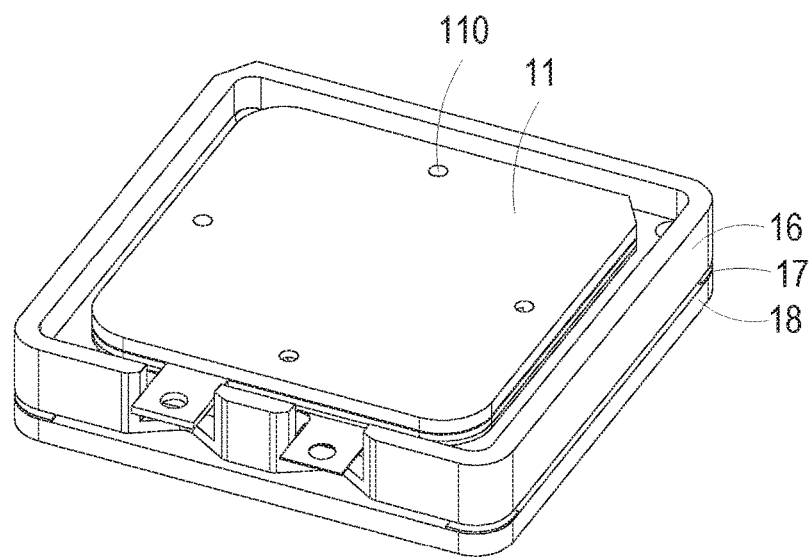
FIG. 1B is a schematic assembled view illustrating the miniature pneumatic device of FIG. 1A.
Figure 2A:
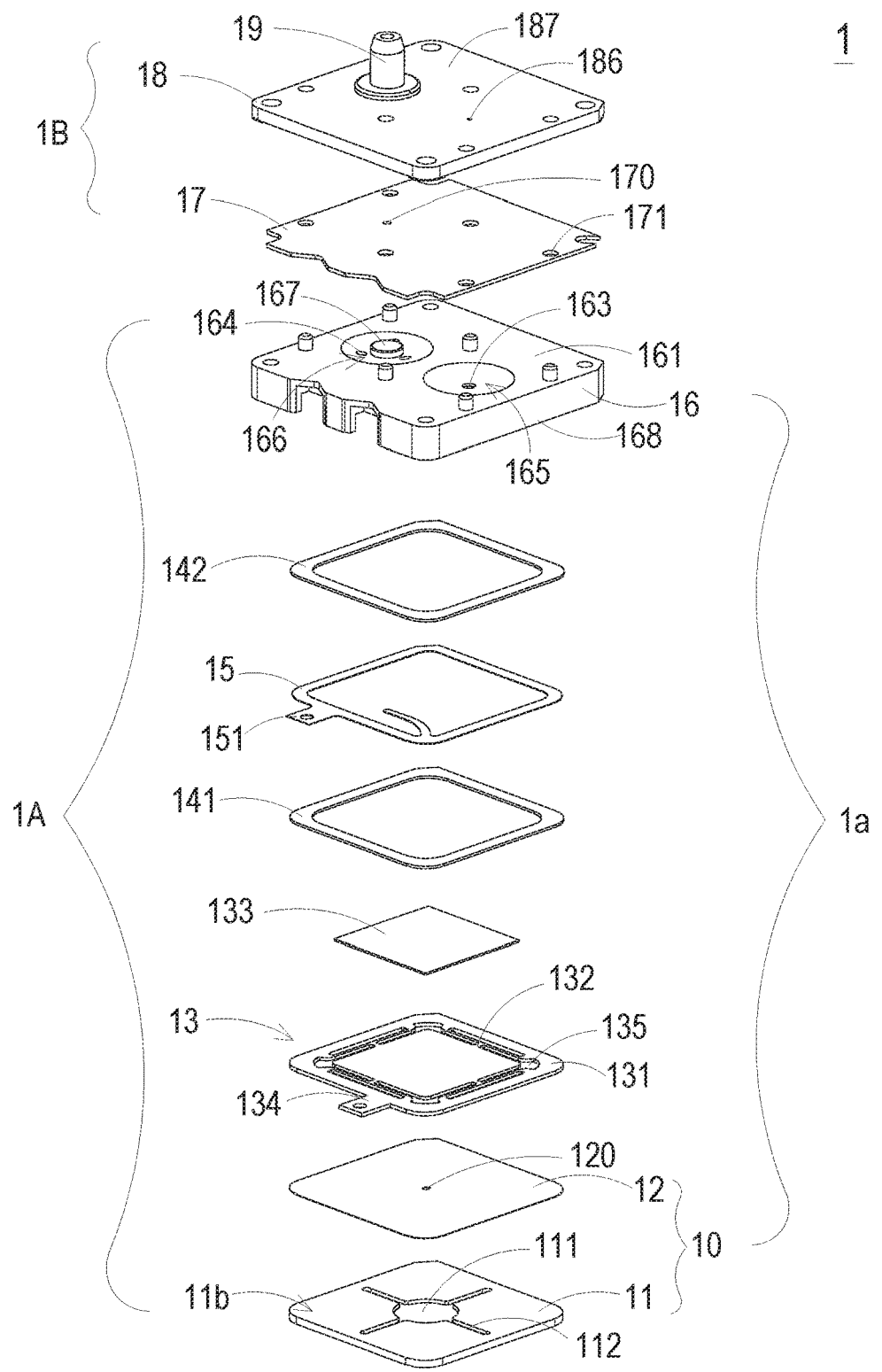
FIG. 2A is a schematic exploded view illustrating the miniature pneumatic device according to the embodiment of the present invention and taken along a second viewpoint.
Figure 2B:
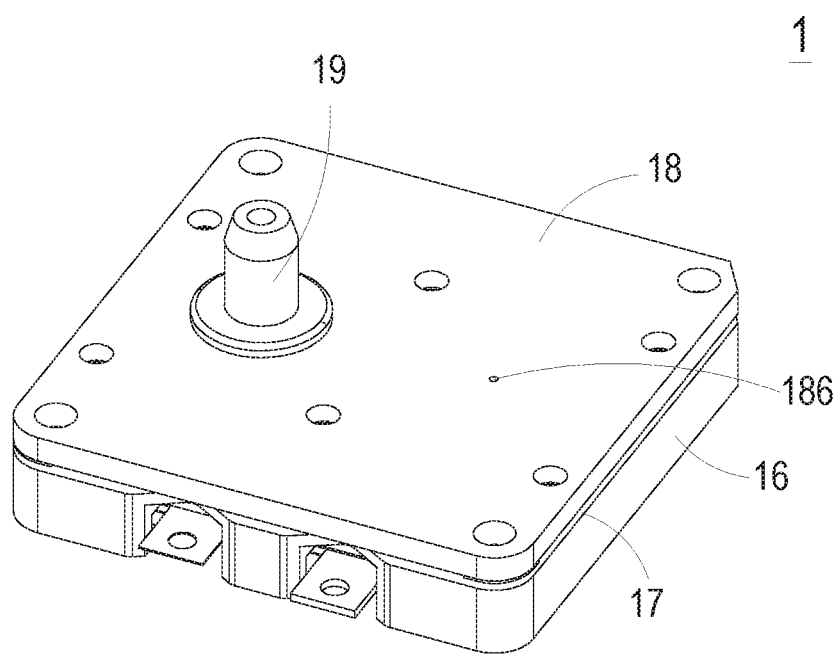
FIG. 2B is a schematic assembled view illustrating the miniature pneumatic device of FIG. 2A.

Please refer to FIGS. 1A, 1B, 2A, 2B and 7A to 7E. FIG. 1A is a schematic exploded view illustrating a miniature pneumatic device according to an embodiment of the present invention and taken along a first viewpoint. FIG. 1B is a schematic assembled view illustrating the miniature pneumatic device of FIG. 1A. FIG. 2A is a schematic exploded view illustrating the miniature pneumatic device according to the embodiment of the present invention and taken along a second viewpoint. FIG. 2B is a schematic assembled view illustrating the miniature pneumatic device of FIG. 2A. FIGS. 7A to 7E schematically illustrate a gas-collecting operation of the miniature pneumatic device of FIG. 1A.

As shown in FIGS. 1A and 2A, the miniature pneumatic device 1 comprises a miniature fluid control device 1A and a miniature valve device 1B. In this embodiment, the miniature fluid control device 1A comprises a housing 1a, a piezoelectric actuator 13, a first insulation plate 141, a conducting plate 15 and a second insulation plate 142. The housing 1a comprises a gas collecting plate 16 and a base 10. The base 10 comprises a gas inlet plate 11 and a resonance plate 12. The piezoelectric actuator 13 is aligned with the resonance plate 12. The gas inlet plate 11, the resonance plate 12, the piezoelectric actuator 13, the first insulation plate 141, the conducting plate 15, the second insulation plate 142 and the gas collecting plate 16 are stacked on each other sequentially. Moreover, the piezoelectric actuator 13 comprises a suspension plate 130, an outer frame 131, at least one bracket 132 and a piezoelectric ceramic plate 133. In this embodiment, the miniature valve device 1B comprises a valve plate 17 and a gas outlet plate 18.

As shown in FIG. 1A, the gas collecting plate 16 comprises a bottom plate and a sidewall 168. The sidewall 168 is protruded from the edges of the bottom plate. The length of the gas collecting plate 16 is in the range between 9 mm and 17 mm. The width of the gas collecting plate 16 is in the range between 9 mm and 17 mm. Preferably, the length/width ratio of the gas collecting plate 16 is in the range between 0.53 and 1.88. Moreover, an accommodation space 16a is defined by the bottom plate and the sidewall 168 collaboratively. The piezoelectric actuator 13 is disposed within the accommodation space 16a. After the miniature pneumatic device 1 is assembled, the resulting structure of the miniature pneumatic device taken from the front side is shown in FIG. 1B and FIGS. 7A to 7E. The miniature fluid control device 1A and the miniature valve device 1B are combined together. That is, the valve plate 17 and the gas outlet plate 18 of the miniature valve device 1B are stacked on each other and positioned on the gas collecting plate 16 of the miniature fluid control device 1A. The gas outlet plate 18 comprises a pressure-releasing perforation 181 and an outlet structure 19. The outlet structure 19 is in communication with an equipment (not shown). When the gas in the miniature valve device 1B releases from the pressure-releasing perforation 181, the pressure-releasing purpose is achieved.

After the miniature fluid control device 1A and the miniature valve device 1B are combined together, the miniature pneumatic device 1 is assembled. Consequently, a gas is fed into the miniature fluid control device 1A through at least one inlet 110 of the gas inlet plate 11. In response to the actions of the piezoelectric actuator 13, the gas is transferred downwardly through plural pressure chambers (not shown). Then, the gas is transferred through the miniature valve device 1B in one direction. The pressure of the gas is accumulated in an equipment (not shown) that is in communication with the outlet structure 19 of the miniature valve device 1B. For releasing the pressure, the output gas amount of the miniature fluid control device 1A is exited from the pressure-releasing perforation 181 of the gas outlet plate 18 of the miniature valve device 1B.

Please refer to FIGS. 1A and 2A again. The gas inlet plate 11 of the miniature fluid control device 1A comprises a first surface 11b, a second surface 11a and the at least one inlet 110. In this embodiment, the gas inlet plate 11 comprises four inlets 110. The inlets 110 run through the first surface 11b and the second surface 11a of the gas inlet plate 11. In response to the action of the atmospheric pressure, the gas can be introduced into the miniature fluid control device 1A through the at least one inlet 110. As shown in FIG. 2A, at least one convergence channel 112 is formed in the first surface 11b of the gas inlet plate 11. The at least one convergence channel 112 is in communication with the at least one inlet 110 in the second surface 11a of the gas inlet plate 11. The number of the at least one convergence channel 112 is identical to the number of the at least one inlet 110. In this embodiment, the gas inlet plate 11 comprises four convergence channels 112. It is noted that the number of the at least one convergence channel 112 and the number of the at least one inlet 110 may be varied according to the practical requirements. Moreover, a central cavity 111 is formed in the first surface 11b of the gas inlet plate 11 and located at a central convergence area of the four convergence channels 112. The central cavity 111 is in communication with the at least one convergence channel 112. After the gas is introduced into the at least one convergence channel 112 through the at least one inlet 110, the gas is guided to the central cavity 111. In this embodiment, the at least one inlet 110, the at least one convergence channel 112 and the central cavity 111 of the gas inlet plate 11 are integrally formed. The central cavity 111 is a convergence chamber for temporarily storing the gas.

Preferably but not exclusively, the gas inlet plate 11 is made of stainless steel. The thickness of the gas inlet plate 11 is in the range between 0.4 mm and 0.6 mm, and preferably 0.5 mm. Moreover, the depth of the convergence chamber defined by the central cavity 111 and the depth of the at least one convergence channel 112 are equal. For example, the depth of the convergence chamber and the depth of the at least one convergence channel 112 are in the range between 0.2 mm and 0.3 mm. Preferably but not exclusively, the resonance plate 12 is made of flexible material. The resonance plate 12 comprises a central aperture 120 corresponding to the central cavity 111 of the gas inlet plate 11. Consequently, the gas can be transferred downwardly through the central aperture 120. Preferably but not exclusively, the resonance plate 12 is made of copper. The thickness of the resonance plate 12 is in the range between 0.03 mm and 0.08 mm, and preferably 0.05 mm.

Figure 3A:
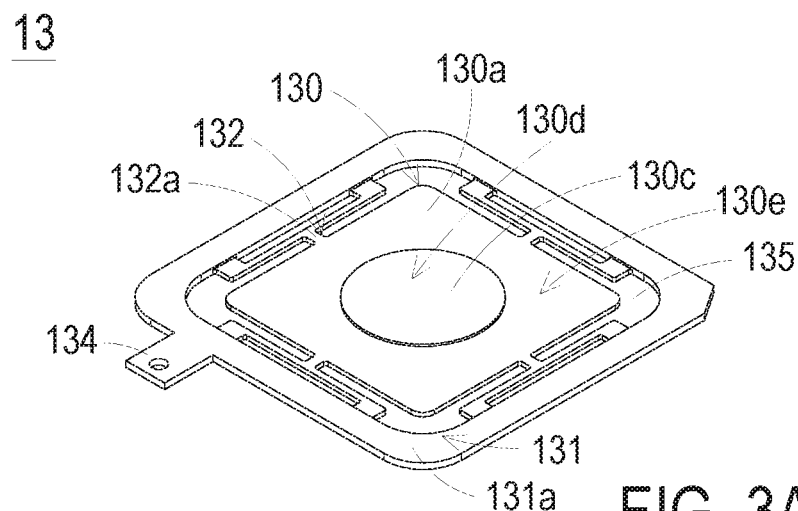
FIG. 3A is a schematic perspective view illustrating the piezoelectric actuator of the miniature pneumatic device of FIG. 1A and taken along the front side.
Figure 3B:
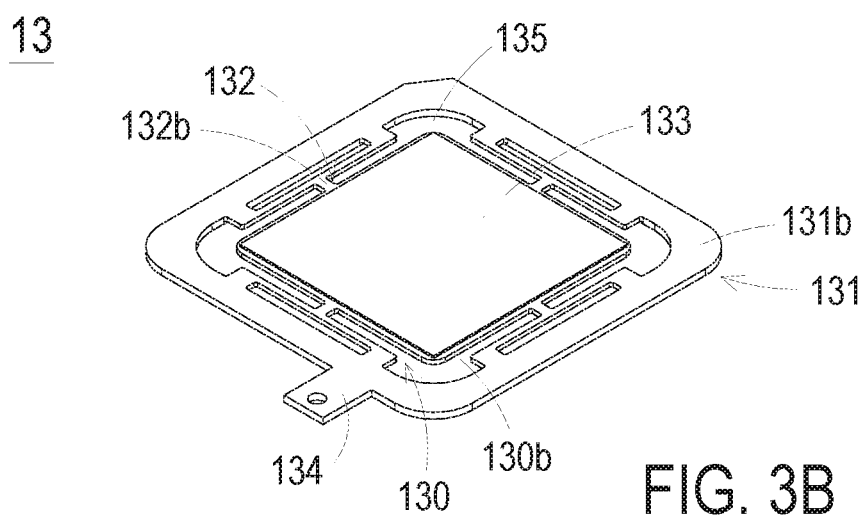
FIG. 3B is a schematic perspective view illustrating the piezoelectric actuator of the miniature pneumatic device of FIG. 1A and taken along the rear side.
Figure 3C:
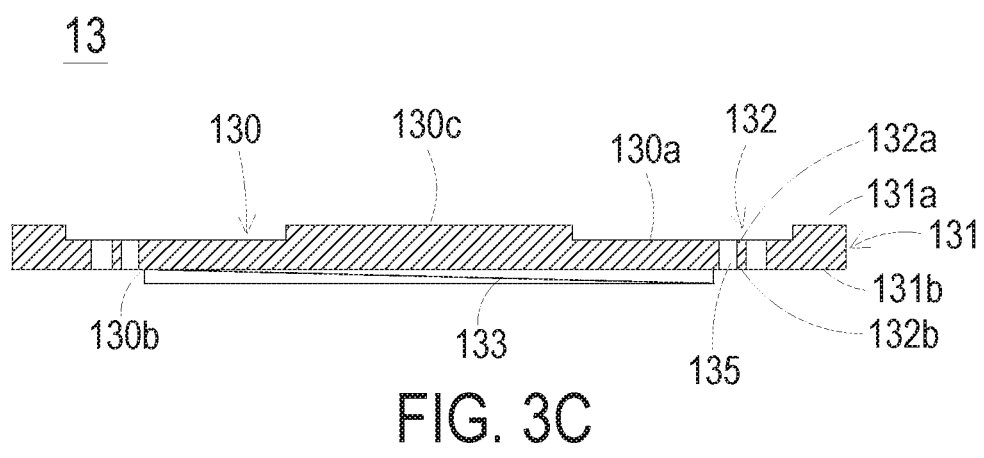
FIG. 3C is a schematic cross-sectional view illustrating the piezoelectric actuator of the miniature pneumatic device of FIG. 1A.

FIG. 3A is a schematic perspective view illustrating the piezoelectric actuator of the miniature pneumatic device of FIG. 1A and taken along the front side. FIG. 3B is a schematic perspective view illustrating the piezoelectric actuator of the miniature pneumatic device of FIG. 1A and taken along the rear side. FIG. 3C is a schematic cross-sectional view illustrating the piezoelectric actuator of the miniature pneumatic device of FIG. 1A. As shown in FIGS. 3A, 3B and 3C, the piezoelectric actuator 13 comprises the suspension plate 130, the outer frame 131, the at least one bracket 132, and the piezoelectric ceramic plate 133. The piezoelectric ceramic plate 133 is attached on a first surface 130b of the suspension plate 130. The piezoelectric ceramic plate 133 is subjected to a curvy vibration in response to an applied voltage. The suspension plate 130 comprises a middle portion 130d and a periphery portion 130e. When the piezoelectric ceramic plate 133 is subjected to the curvy vibration, the suspension plate 130 is subjected to the curvy vibration from the middle portion 130d to the periphery portion 130e. The at least one bracket 132 is arranged between the suspension plate 130 and the outer frame 131. That is, the at least one bracket 132 is connected between the suspension plate 130 and the outer frame 131. The two ends of the bracket 132 are connected with the outer frame 131 and the suspension plate 130, respectively. Consequently, the bracket 131 can elastically support the suspension plate 130. Moreover, at least one vacant space 135 is formed between the bracket 132, the suspension plate 130 and the outer frame 131 for allowing the gas to go through. The type of the suspension plate 130 and the outer frame 131 and the type and the number of the at least one bracket 132 may be varied according to the practical requirements. Moreover, a conducting pin 134 is protruded outwardly from the outer frame 131 so as to be electrically connected with an external circuit (not shown).

In this embodiment, the suspension plate 130 is a stepped structure. That is, the suspension plate 130 comprises a bulge 130c. The bulge 130c is formed on a second surface 130a of the suspension plate 130. For example, the bulge 130c is a circular convex structure. The thickness of the bulge 130c is in the range between 0.02 mm and 0.08 mm, and preferably 0.03 mm. Preferably but not exclusively, the diameter of the bulge 130c is 0.55 times the short side length of the suspension plate 130. As shown in FIGS. 3A and 3C, a top surface of the bulge 130c of the suspension plate 130 is coplanar with a second surface 131a of the outer frame 131, and the second surface 130a of the suspension plate 130 is coplanar with a second surface 132a of the bracket 132. Moreover, the bulge 130c of the suspension plate 130 (or the second surface 131a of the outer frame 131) has a specified thickness with respect to the second surface 130a of the suspension plate 130 (or the second surface 132a of the bracket 132). As shown in FIGS. 3B and 3C, a first surface 130b of the suspension plate 130, a first surface 131b of the outer frame 131 and a first surface 132b of the bracket 132 are coplanar with each other. The piezoelectric ceramic plate 133 is attached on the first surface 130b of the suspension plate 130. In some other embodiments, the suspension plate 130 is a square plate structure with two flat surfaces. That is, the structure of the suspension plate 130 may be varied according to the practical requirements. In this embodiment, the suspension plate 130, the at least bracket 132 and the outer frame 131 are integrally formed and produced by using a metal plate (e.g., a stainless steel plate). The thickness of the suspension plate 130 is in the range between 0.1 mm and 0.4 mm, and preferably 0.27 mm. The length of the suspension plate 130 is in the range between 4 mm and 8 mm, and preferably in the range between 6 mm and 8 mm. The width of the suspension plate 130 is in the range between 4 mm and 8 mm, and preferably in the range between 6 mm and 8 mm. The thickness of the outer frame 131 is in the range between 0.2 mm and 0.4 mm, and preferably 0.3 mm.

The thickness of the piezoelectric ceramic plate 133 is in the range between 0.05 mm and 0.3 mm, and preferably 0.10 mm. The length of the piezoelectric ceramic plate 133 is not larger than the length of the suspension plate 130. The length of the piezoelectric ceramic plate 133 is in the range between 4 mm and 8 mm, and preferably in the range between 6 mm and 8 mm. The width of the piezoelectric ceramic plate 133 is in the range between 4 mm and 8 mm, and preferably in the range between 6 mm and 8 mm. Moreover, the length/width ratio of the piezoelectric ceramic plate 133 is in the range between 0.5 and 2. In some embodiments, the length of the piezoelectric ceramic plate 133 is smaller than the length of the suspension plate 130. Similarly, the piezoelectric ceramic plate 133 is a square plate structure corresponding to the suspension plate 130.

Preferably, the suspension plate 130 of the piezoelectric actuator 13 used in the miniature pneumatic device 1 of the present invention is a square suspension plate. In comparison with the circular suspension plate (e.g., the circular suspension plate j0 as shown in FIG. 4A), the square suspension plate is more power-saving.

Generally, the consumed power of the capacitive load at the resonance frequency is positively related to the resonance frequency. Since the resonance frequency of the square suspension plate is obviously lower than that of the circular square suspension plate, the consumed power of the square suspension plate is lower. Since the square suspension plate is more power-saving than the circular suspension plate, the square suspension plate is suitably used in the wearable device.

Figure 4A:
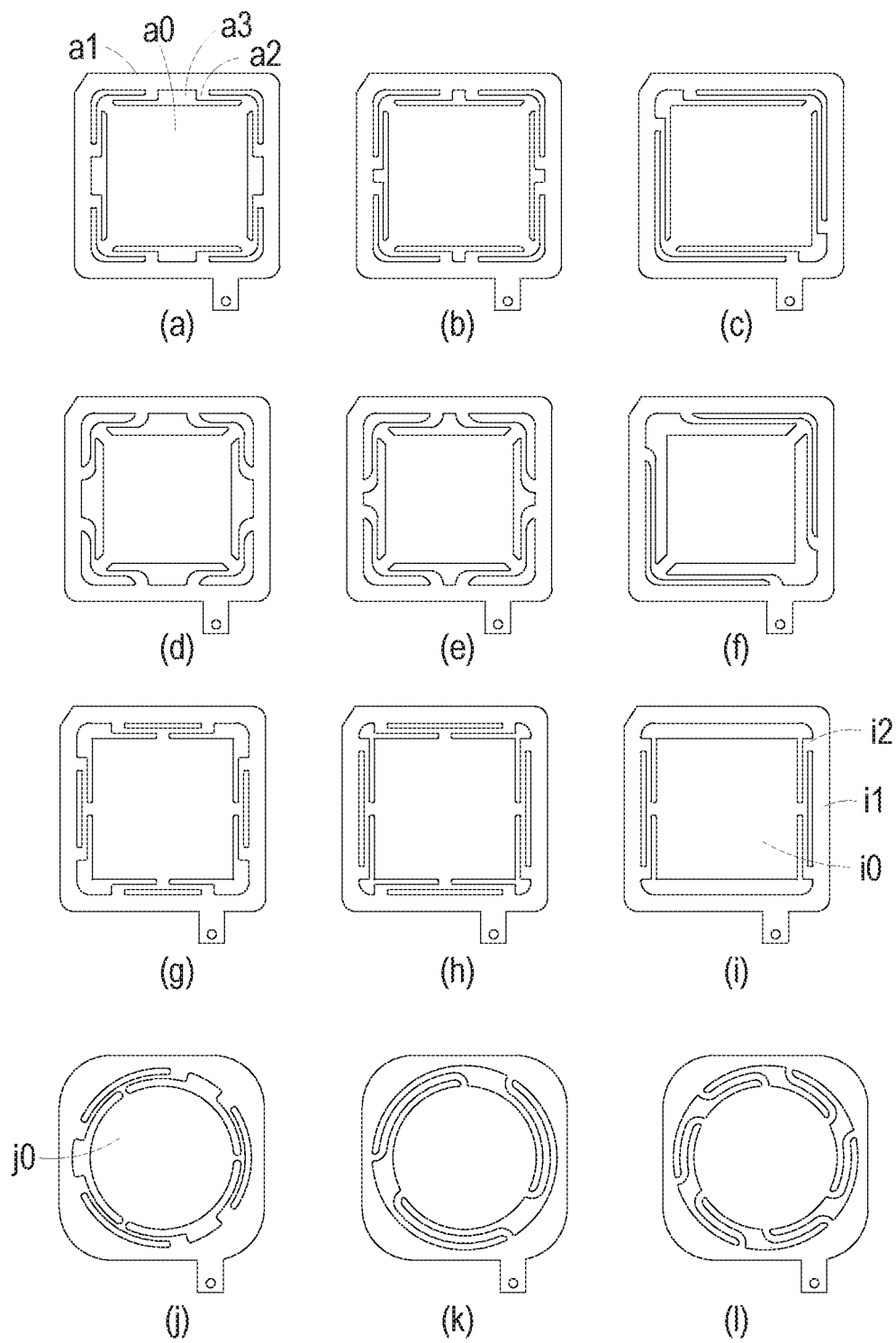
FIGS. 4A to 4C schematically illustrate various exemplary piezoelectric actuator used in the miniature pneumatic device of the present invention.
Figure 4B:
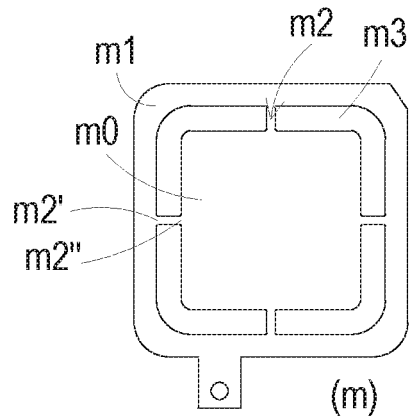
Figure 4B:
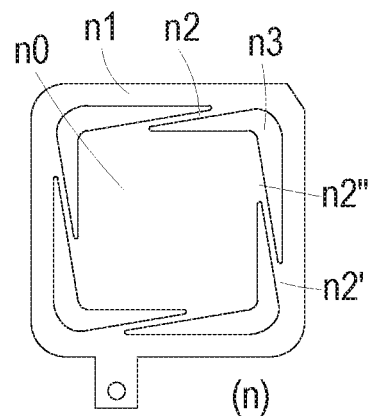
Figure 4B:
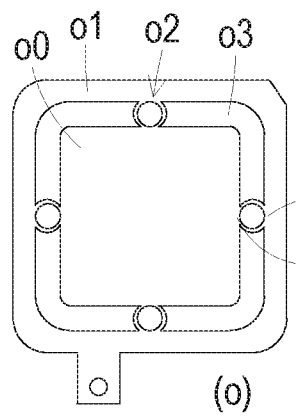
Figure 4B:
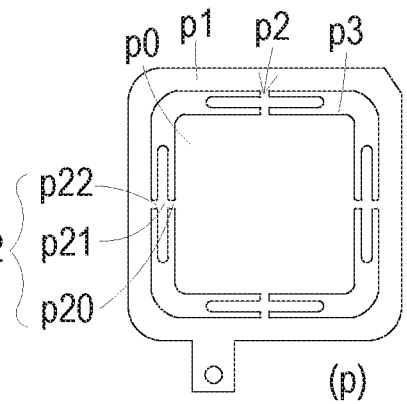
Figure 4B:
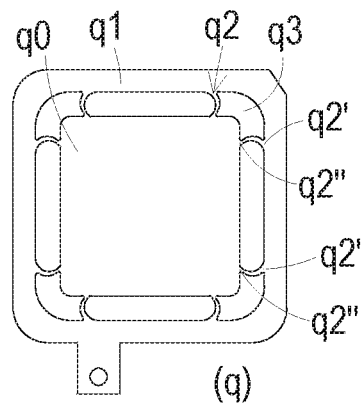
Figure 4B:
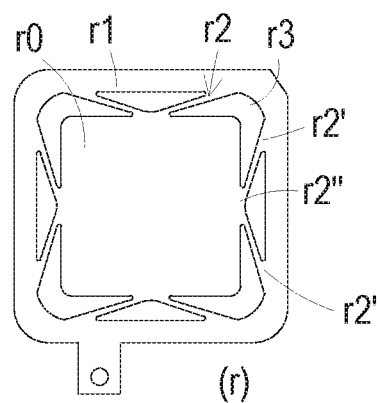
Figure 4C:
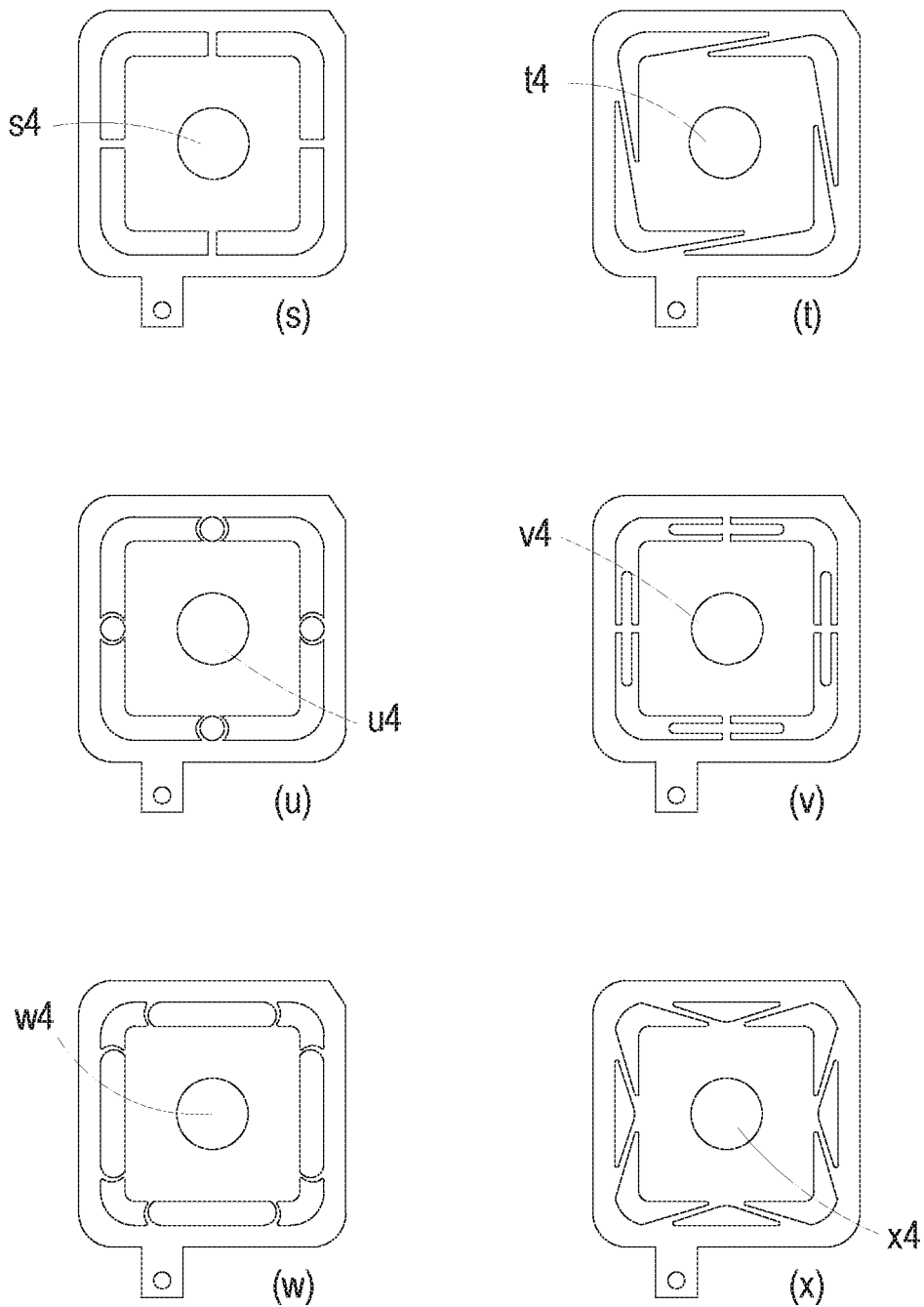

FIGS. 4A, 4B and 4C schematically illustrate various exemplary piezoelectric actuator used in the miniature pneumatic device of the present invention. As shown in the drawings, the suspension plate 130, the outer frame 131 and the at least one bracket 132 of the piezoelectric actuator 13 have various types.

FIG. 4A schematically illustrates the types (a)~(l) of the piezoelectric actuator. In the type (a), the outer frame a1 and the suspension plate a0 are square, the outer frame a1 and the suspension plate a0 are connected with each other through eight brackets a2, and a vacant space a3 is formed between the brackets a2, the suspension plate a0 and the outer frame a1 for allowing the gas to go through. In the type (i), the outer frame i1 and the suspension plate i0 are also square, but the outer frame i1 and the suspension plate i0 are connected with each other through two brackets i2. In addition, the outer frame and the suspension plate in each of the types (b)~(h) are also square. In each of the types (j)~(l), the suspension plate is circular, and the outer frame has a square with arc-shaped corners. For example, in the type (j), the suspension plate j0 is circular, and the outer frame has a square with arc-shaped corners.

FIG. 4B schematically illustrates the types (m)~(r) of the piezoelectric actuator. In these types (m)~(r), the suspension plate 130 and the outer frame 131 are square. In the type (m), the outer frame m1 and the suspension plate m0 are square, the outer frame m1 and the suspension plate m0 are connected with each other through four brackets m2, and a vacant space m3 is formed between the brackets m2, the suspension plate m0 and the outer frame m1 for allowing the gas to go through. The bracket m2 between the outer frame m1 and the suspension plate m0 is a connecting part. The bracket m2 has two ends m2' and m2". The end m2' of the bracket m2 is connected with the outer frame m1. The end m2" of the bracket m2 is connected with the suspension plate m0. The two ends m2' and m2" are opposed to each other and arranged along the same horizontal line. In the type (n), the outer frame n1 and the suspension plate m0 are square, the outer frame n1 and the suspension plate n0 are connected with each other through four brackets n2, and a vacant space n3 is formed between the brackets n2, the suspension plate n0 and the outer frame n1 for allowing the gas to go through. The bracket n2 between the outer frame n1 and the suspension plate n0 is a connecting part. The bracket n2 has two ends n2' and n2". The end n2' of the bracket n2 is connected with the outer frame n1. The end n2" of the bracket n2 is connected with the suspension plate n0. The two ends n2' and n2" are not arranged along the same horizontal line. For example, the two ends n2' and n2" are inclined at 0~45 degrees with respect to the horizontal line, and the two ends n2' and n2" are interlaced. In the type (o), the outer frame of and the suspension plate o0 are square, the outer frame of and the suspension plate o0 are connected with each other through four brackets o2, and a vacant space o3 is formed between the brackets o2, the suspension plate o0 and the outer frame of for allowing the gas to go through. The bracket o2 between the outer frame o1 and the suspension plate o0 is a connecting part. The bracket o2 has two ends o2' and o2". The end o2' of the bracket o2 is connected with the outer frame o1. The end o2" of the bracket o2 is connected with the suspension plate o0. The two ends o2' and o2" are opposed to each other and arranged along the same horizontal line. In comparison with the above types, the profile of the bracket o2 is distinguished.

In the type (p), the outer frame p1 and the suspension plate p0 are square, the outer frame p1 and the suspension plate p0 are connected with each other through four brackets p2, and a vacant space p3 is formed between the brackets p2, the suspension plate p0 and the outer frame p1 for allowing the gas to go through. The bracket p2 between the outer frame p1 and the suspension plate p0 comprises a first connecting part p20, an intermediate part p21 and a second connecting part p22. The intermediate part p21 is formed in the vacant space p3 and in parallel with the outer frame p1 and the suspension plate p0. The first connecting part p20 is arranged between the intermediate part p21 and the suspension plate p0. The second connecting part p22 is arranged between the intermediate part p21 and the outer frame p1. The first connecting part p20 and the second connecting part p22 are opposed to each other and arranged along the same horizontal line.

In the type (q), the outer frame q1, the suspension plate q0, the bracket q2 and the vacant space q3 are similar to those of the type (m) and the type (o). However, the structure of the bracket q2 is distinguished. The suspension plate q0 is square. Each side of the suspension plate q0 is connected with the corresponding side of the outer frame q1 through two connecting parts q2. The two ends q2' and q2" of each connecting part q2 are opposed to each other and arranged along the same horizontal line. In the type (r), the outer frame r1, the suspension plate r0, the bracket r2 and the vacant space r3 are similar to those of the above embodiments. However, the bracket r2 is a V-shaped connecting part. That is, the bracket r2 is connected with the outer frame r1 and the suspension plate r0 at an inclined angle 0~45 degrees. An end r2" of the bracket r2 is connected with the suspension plate r0, and two ends r2' of the bracket r2 is connected with the outer frame r1. That is, the ends b2' and b" are not arranged along the same horizontal line.

FIG. 4C schematically illustrates the types (s)~(x) of the piezoelectric actuator. The structures of the types (s)~(x) are similar to those of the types (m)~(r), respectively. However, in the types (s)~(x), the suspension plate 130 of the piezoelectric actuator 13 has a bulge 130c. The bulges 130c in the types (s)~(x) are indicated as s4, t4, u4, v4, w4 and x4, respectively. The suspension plate 130 is square, and thus the power-saving efficacy is achieved. As mentioned above, the stepped structure comprising the bulge and the square plate structure with two flat surfaces are suitably used as the suspension plates of the present invention. Moreover, the number of the brackets 132 between the outer frame 131 and the suspension plate 130 may be varied according to the practical requirements. Moreover, the suspension plate 130, the outer frame 131 and the at least one bracket 132 are integrally formed with each other and produced by a conventional machining process, a photolithography and etching process, a laser machining process, an electroforming process, an electric discharge machining process and so on.

Please refer to FIGS. 1A and 2A again. The miniature fluid control device 1A further comprises the first insulation plate 141, the conducting plate 15 and the second insulation plate 142. The first insulation plate 141, the conducting plate 15 and the second insulation plate 142 are stacked on each other sequentially and located under the piezoelectric actuator 13. The profiles of the first insulation plate 141, the conducting plate 15 and the second insulation plate 142 substantially match the profile of the outer frame 131 of the piezoelectric actuator 13. The first insulation plate 141 and the second insulation plate 142 are made of an insulating material (e.g. a plastic material) for providing insulating efficacy. The conducting plate 15 is made of an electrically conductive material (e.g. a metallic material) for providing electrically conducting efficacy. Moreover, the conducting plate 15 has a conducting pin 151 so as to be electrically connected with an external circuit (not shown).

Figure 5A:
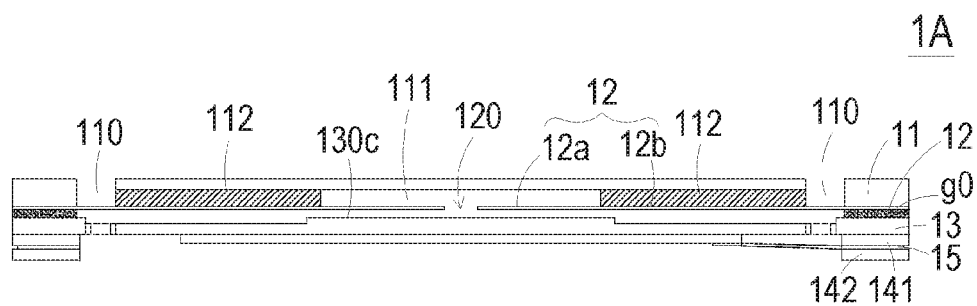
FIGS. 5A to 5E schematically illustrate the actions of the miniature fluid control device of the miniature pneumatic device of FIG. 1A.
Figure 5B:
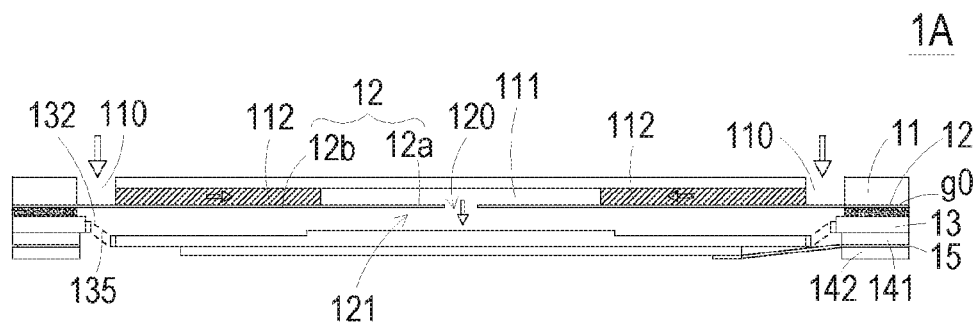

FIGS. 5A to 5E schematically illustrate the actions of the miniature fluid control device of the miniature pneumatic device of FIG. 1A. As shown in FIG. 5A, the gas inlet plate 11, the resonance plate 12, the piezoelectric actuator 13, the first insulation plate 141, the conducting plate 15 and the second insulation plate 142 of the miniature fluid control device 1A are stacked on each other sequentially. Moreover, there is a gap g0 between the resonance plate 12 and the outer frame 131 of the piezoelectric actuator 13. In this embodiment, a filler (e.g. a conductive adhesive) is inserted into the gap g0. Consequently, the depth of the gap g0 between the resonance plate 12 and the bulge 130c of the suspension plate 130 can be maintained to guide the gas to flow more quickly. Moreover, due to the proper distance between the resonance plate 12 and the bulge 130c of the suspension plate 130, the contact interference is reduced and the generated noise is largely reduced.

Please refer to FIGS. 5A to 5E again. After the gas inlet plate 11, the resonance plate 12 and the piezoelectric actuator 13 are combined together, a convergence chamber for converging the gas is defined by the central aperture 120 of the resonance plate 12 and the gas inlet plate 11 collaboratively, and a first chamber 121 is formed between the resonance plate 12 and the piezoelectric actuator 13 for temporarily storing the gas. Through the central aperture 120 of the resonance plate 12, the first chamber 121 is in communication with the central cavity 111 that is formed in the first surface 11b of the gas inlet plate 11. The peripheral regions of the first chamber 121 are in communication with the underlying miniature valve device 1B through the vacant space 135 of the piezoelectric actuator 13.

When the miniature fluid control device 1A of the miniature pneumatic device 1 is enabled, the piezoelectric actuator 13 is actuated by an applied voltage. Consequently, the piezoelectric actuator 13 is vibrated along a vertical direction in a reciprocating manner by using the bracket 132 as a fulcrum. The resonance plate 12 is light and thin. Please refer to FIG. 5B. When the piezoelectric actuator 13 is vibrated downwardly in response to the applied voltage, the resonance plate 12 is vibrated along the vertical direction in the reciprocating manner because of the resonance of the piezoelectric actuator 13. More especially, the portion of the resonance plate 12 corresponding to the central cavity 111 of the gas inlet plate 11 is also subjected to a curvy deformation. Hereinafter, the region of the resonance plate 12 corresponding to the central cavity 111 of the gas inlet plate 11 is also referred as a movable part 12a of the resonance plate 12. When the piezoelectric actuator 13 is vibrated downwardly, the movable part 12a of the resonance plate 12 is subjected to the curvy deformation because the movable part 12a of the resonance plate 12 is pushed by the gas and vibrated in response to the piezoelectric actuator 13. After the gas is fed into the at least one inlet 110 of the gas inlet plate 11, the gas is transferred to the central cavity 111 of the gas inlet plate 11 through the at least one convergence channel 112. Then, the gas is transferred through the central aperture 120 of the resonance plate 12, and introduced downwardly into the first chamber 121. As the piezoelectric actuator 13 is actuated, the resonance of the resonance plate 12 occurs. Consequently, the movable part 12 of the resonance plate 12 is also vibrated along the vertical direction in the reciprocating manner.

Figure 5C:
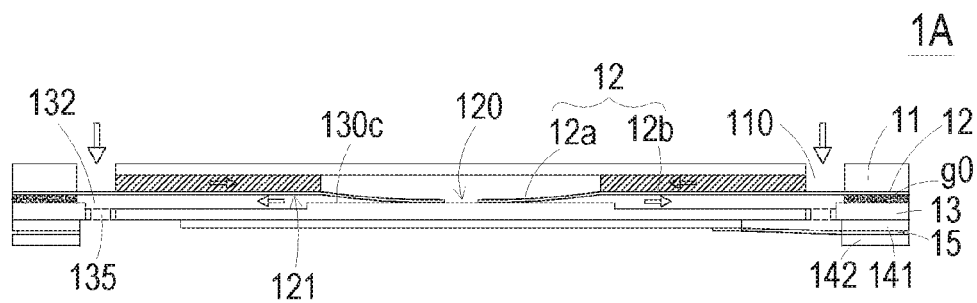

As shown in FIG. 5C, the resonance plate 12 is vibrated downwardly and contacted with the bulge 130c of the suspension plate 130 of the piezoelectric actuator 13. The region of the resonance plate 12 excluding the movable part 12a is also referred as a fixed part 12b. Meanwhile, the gap between the suspension plate 130 and the fixed part 12b of the resonance plate 12 is not reduced. Due to the deformation of the resonance plate 12, the volume of the first chamber 121 is shrunken and a middle communication space of the first chamber 121 is closed. Under this circumstance, the gas is pushed toward peripheral regions of the first chamber 121. Consequently, the gas is transferred downwardly through the vacant space 135 of the piezoelectric actuator 13.

Figure 5D:
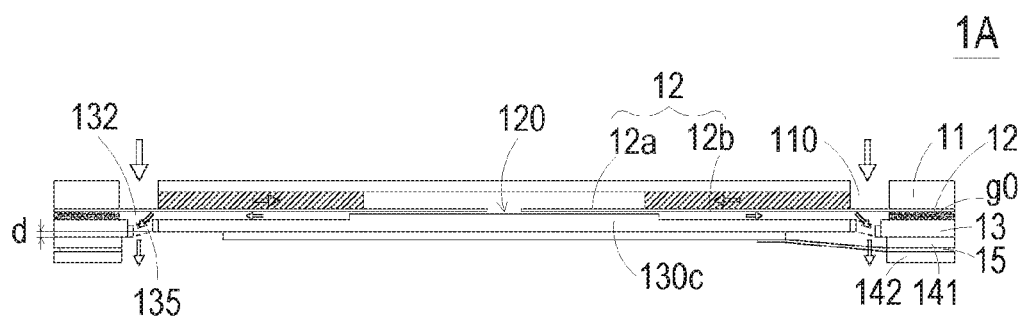

As shown in FIG. 5D, the resonance plate 12 is returned to its original position after the movable part 12a of the resonance plate 12 is subjected to the curvy deformation. Then, the piezoelectric actuator 13 is vibrated upwardly in response to the applied voltage. Consequently, the volume of the first chamber 121 is also shrunken. Since the piezoelectric actuator 13 is ascended at a vibration displacement d, the gas is continuously pushed toward peripheral regions of the first chamber 121. Meanwhile, the gas is continuously fed into the at least one inlet 110 of the gas inlet plate 11, and transferred to the central cavity 111.

Figure 5E:
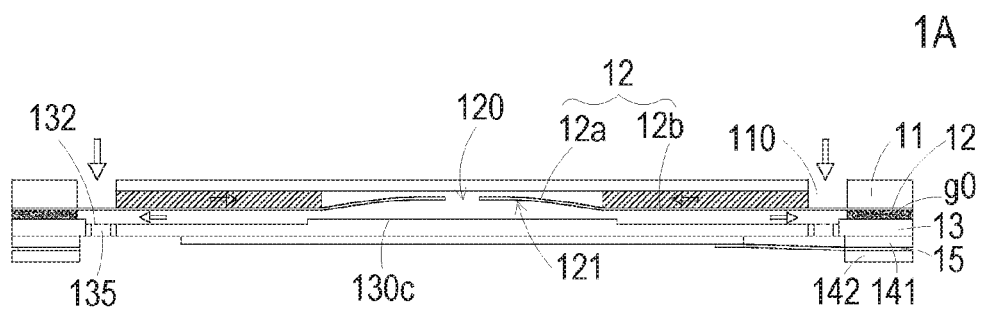

Then, as shown in FIG. 5E, the resonance plate 12 is moved upwardly because the piezoelectric actuator 13 is vibrated upwardly. That is, the movable part 12a of the resonance plate 12 is moved upwardly. Under this circumstance, the gas in the central cavity 111 is transferred to the first chamber 121 through the central aperture 120 of the resonance plate 12, then the gas is transferred downwardly through the vacant space 135 of the piezoelectric actuator 13, and finally the gas is exited from the miniature fluid control device 1A.

From the above discussions, when the resonance plate 12 is vibrated along the vertical direction in the reciprocating manner, the gap g0 between the resonance plate 12 and the piezoelectric actuator 13 is helpful to increase the amplitude of the resonance plate 12. That is, due to the gap g0 between the resonance plate 12 and the piezoelectric actuator 13, the amplitude of the resonance plate 12 is increased when the resonance occurs. The difference x between the gap g0 and the vibration displacement d of the piezoelectric actuator 13 is given by a formula: $x=g0-d$. A series of tests about the maximum output pressure of the miniature pneumatic device 1 corresponding to different values of x are performed. In case that $x0 \leq \mu m$, the miniature pneumatic device 1 generates noise. In case that $x=1\sim5$ μm, the maximum output pressure of the miniature pneumatic device 1 is 350 mmHg. In case that $x=5\sim10$ μm, the maximum output pressure of the miniature pneumatic device 1 is 250 mmHg. In case that $x=10\sim15$ μm, the maximum output pressure of the miniature pneumatic device 1 is 150 mmHg. The relationships between the difference x and the maximum output pressure are listed in Table 1. The values of Table 1 are obtained when the operating frequency is in the range between 17 kHz and 20 kHz and the operating voltage is in the range between ±10V and ±20V. Consequently, a pressure gradient is generated in the fluid channels of the miniature fluid control device 1A to facilitate the gas to flow at a high speed. Moreover, since there is an impedance difference between the feeding direction and the exiting direction, the gas can be transmitted from the inlet side to the outlet side. Moreover, even if the outlet side has a gas pressure, the miniature fluid control device 1A still has the capability of pushing out the gas while achieving the silent efficacy.

TABLE 1

| Test | x | Maximum output pressure |
|---|---|---|
| 1 | x = 1~5 μm | 350 mmHg |
| 2 | x = 5~10 μm | 250 mmHg |
| 3 | x = 10~15 μm | 150 mmHg |

In some embodiments, the vibration frequency of the resonance plate 12 along the vertical direction in the reciprocating manner is identical to the vibration frequency of the piezoelectric actuator 13. That is, the resonance plate 12 and the piezoelectric actuator 13 are synchronously vibrated along the upward direction or the downward direction. It is noted that numerous modifications and alterations of the actions of the miniature fluid control device 1A may be made while retaining the teachings of the invention.

Figure 6A:
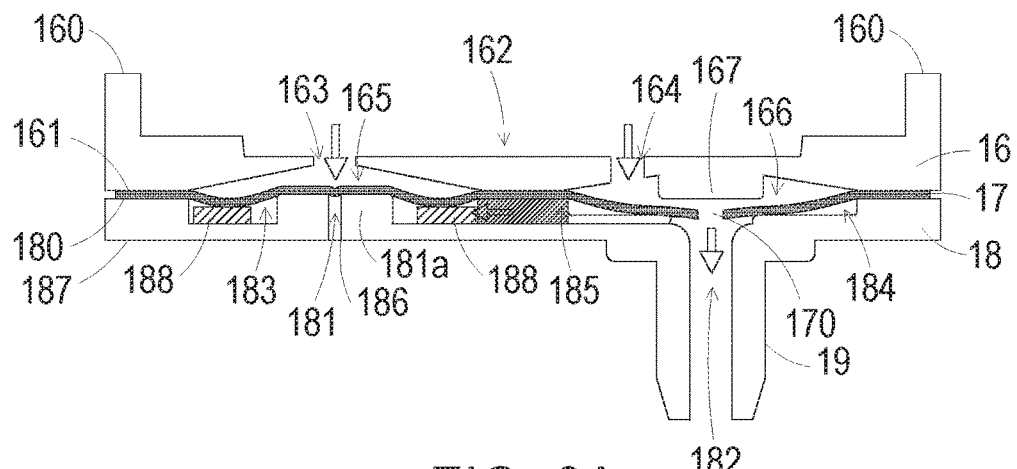
FIG. 6A schematically illustrate a gas-collecting operation of the gas collecting plate and miniature valve device of the miniature pneumatic device of FIG. 1A.
Figure 6B:
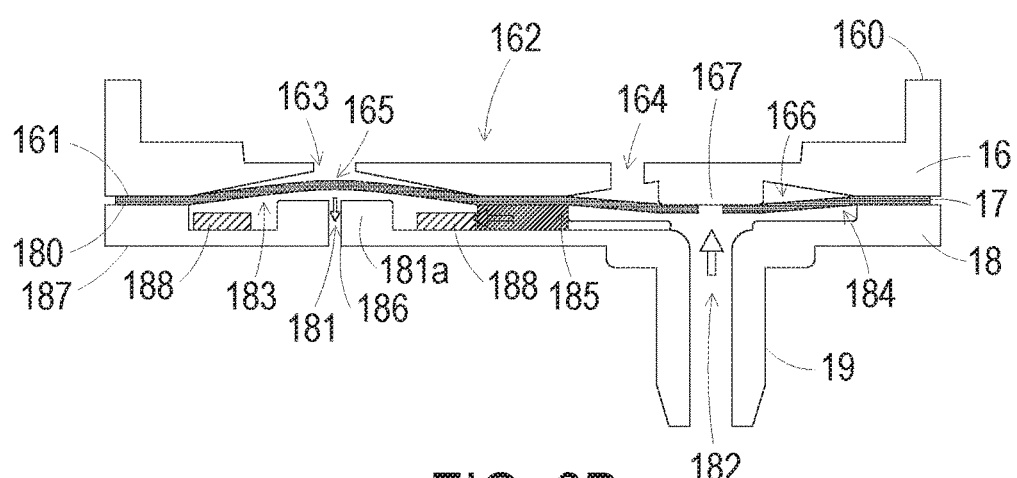
FIG. 6B schematically illustrate a gas-releasing operation of the gas collecting plate and miniature valve device of the miniature pneumatic device of FIG. 1A.

Please refer to FIGS. 1A, 2A, 6A and 6B. FIG. 6A schematically illustrate a gas-collecting operation of the gas collecting plate and miniature valve device of the miniature pneumatic device of FIG. 1A. FIG. 6B schematically illustrate a gas-releasing operation of the gas collecting plate and miniature valve device of the miniature pneumatic device of FIG. 1A. As shown in FIGS. 1A and 6A, the valve plate 17 and the gas outlet plate 18 of the miniature valve device 1B are stacked on each other sequentially. Moreover, the miniature valve device 1B and the gas collecting plate 16 of the miniature fluid control device 1A cooperate with each other.

The gas collecting plate 16 comprises a first surface 160 and a second surface 161 (also referred as a fiducial surface). The first surface 160 of the gas collecting plate 16 is concaved to define a gas-collecting chamber 162. The piezoelectric actuator 13 is accommodated within the gas-collecting chamber 162. The gas that is transferred downwardly by the miniature fluid control device 1A is temporarily accumulated in the gas-collecting chamber 162. The gas collecting plate 16 comprises a first perforation 163 and a second perforation 164. A first end of the first perforation 163 and a first end of the second perforation 164 are in communication with the gas-collecting chamber 162. A second end of the first perforation 163 and a second end of the second perforation 164 are in communication with a first pressure-releasing chamber 165 and a first outlet chamber 166, which are formed in the second surface 161 of the gas collecting plate 16. Moreover, the gas collecting plate 16 has a raised structure 167 corresponding to the first outlet chamber 166. For example, the raised structure 167 includes but is not limited to a cylindrical post. The raised structure 167 is located at a level higher than the second surface 161 of the gas collecting plate 16. Moreover, a thickness of the raised structure 167 is in a range between 0.3 mm and 0.55 mm, and preferably 0.4 mm.

The gas outlet plate 18 comprises a pressure-releasing perforation 181, an outlet perforation 182, a first surface 180 (also referred as a fiducial surface) and a second surface 187. The pressure-releasing perforation 181 and the outlet perforation 182 run through the first surface 180 and the second surface 187. The first surface 180 of the gas outlet plate 18 is concaved to define a second pressure-releasing chamber 183 and a second outlet chamber 184. The pressure-releasing perforation 181 is located at a center of the second pressure-releasing chamber 183. Moreover, the gas outlet plate 18 further comprises a communication channel 185 between the second pressure-releasing chamber 183 and the second outlet chamber 184 for allowing the gas to go through. A first end of the outlet perforation 182 is in communication with the second outlet chamber 184. A second end of the outlet perforation 182 is in communication with an outlet structure 19. The outlet structure 19 is in connected with an equipment (not shown). The equipment is for example but not limited to a gas-pressure driving equipment.

The valve plate 17 comprises a valve opening 170 and plural positioning openings 171 (see FIG. 1A). The thickness of the valve plate 17 is in the range between 0.1 mm and 0.3 mm, and preferably 0.2 mm.

After the gas collecting plate 16, the valve plate 17 and the gas outlet plate 18 are combined together, the pressure-releasing perforation 181 of the gas outlet plate 18 is aligned with the first perforation 163 of the gas collecting plate 16, the second pressure-releasing chamber 183 of the gas outlet plate 18 is aligned with the first pressure-releasing chamber 165 of the gas collecting plate 16, and the second outlet chamber 184 of the gas outlet plate 18 is aligned with the first outlet chamber 166 of the gas collecting plate 16. The valve plate 17 is arranged between the gas collecting plate 16 and the gas outlet plate 18 for blocking the communication between the first pressure-releasing chamber 165 and the second pressure-releasing chamber 183. The valve opening 170 of the valve plate 17 is arranged between the second perforation 164 and the outlet perforation 182. Moreover, the valve opening 170 of the valve plate 17 is aligned with the raised structure 167 corresponding to the first outlet chamber 166 of the gas collecting plate 16. Due to the arrangement of the single valve opening 170, the gas is transferred through the miniature valve device 1B in one direction in response to the pressure difference.

In this embodiment, the gas outlet plate 18 has the convex structure 181a beside a first end of the pressure-releasing perforation 181. Preferably but not exclusively, the convex structure 181a is a cylindrical post. The thickness of the convex structure 181a is in the range between 0.3 mm and 0.55 mm, and preferably 0.4 mm. The top surface of the convex structure 181a is located at a level higher than the first surface 180 of the gas outlet plate 18. Consequently, the pressure-releasing perforation 181 can be quickly contacted with and closed by the valve plate 17. Moreover, the convex structure 181a can provide a pre-force to achieve a good sealing effect. In this embodiment, the gas outlet plate 18 further comprises a position-limiting structure 188. The thickness of the position-limiting structure 188 is 0.32 mm. The position-limiting structure 188 is disposed within the second pressure-releasing chamber 183. Preferably but not exclusively, the position-limiting structure 188 is a ring-shaped structure. While the gas-collecting operation of the miniature valve device 1B is performed, the position-limiting structure 188 can assist in supporting the valve plate 17 and avoid collapse of the valve plate 17. Consequently, the valve plate 17 can be opened or closed more quickly.

Hereinafter, the gas-collecting operation of the miniature valve device 1B will be illustrated with reference to FIG. 6A. In case that the gas from the miniature fluid control device 1A is transferred downwardly to the miniature valve device 1B or the ambient air pressure is higher than the inner pressure of the equipment which is in communication with the outlet structure 19, the gas will be transferred from the miniature fluid control device 1A to the gas-collecting chamber 162 of the gas collecting plate 16. Then, the gas is transferred downwardly to the first pressure-releasing chamber 165 and the first outlet chamber 166 through the first perforation 163 and the second perforation 164. In response to the downward gas, the flexible valve plate 17 is subjected to a downward curvy deformation. Consequently, the volume of the first pressure-releasing chamber 165 is expanded, and the valve plate 17 is in close contact with the first end of the pressure-releasing perforation 181 corresponding to the first perforation 163. Under this circumstance, the pressure-releasing perforation 181 of the gas outlet plate 18 is closed, and thus the gas within the second pressure-releasing chamber 183 is not leaked out from the pressure-releasing perforation 181. In this embodiment, the gas outlet plate 18 has the convex structure 181a beside of the first end of the pressure-releasing perforation 181. Due to the arrangement of the convex structure 181a, the pressure-releasing perforation 181 can be quickly closed by the valve plate 17. Moreover, the convex structure 181a can provide a pre-force to achieve a good sealing effect. The position-limiting structure 188 is arranged around the pressure-releasing perforation 181 to assist in supporting the valve plate 17 and avoid collapse of the valve plate 17. On the other hand, the gas is transferred downwardly to the first outlet chamber 166 through the second perforation 164. In response to the downward gas, the valve plate 17 corresponding to the first outlet chamber 166 is also subjected to the downward curvy deformation. Consequently, the valve opening 170 of the valve membrane 17 is correspondingly opened to the downward side. Under this circumstance, the gas is transferred from the first outlet chamber 166 to the second outlet chamber 184 through the valve opening 170. Then, the gas is transferred to the outlet structure 19 through the outlet perforation 182 and then transferred to the equipment which is in communication with the outlet structure 19. Consequently, the purpose of collecting the gas pressure is achieved.

Hereinafter, the gas-releasing operation of the miniature valve device 1B will be illustrated with reference to FIG. 6B. For performing the gas-releasing operation, the user may adjust the amount of the gas to be fed into the miniature fluid control device 1A, so that the gas is no longer transferred to the gas-collecting chamber 162. Alternatively, in case that the inner pressure of the equipment which is in communication with the outlet structure 19 is higher than the ambient air pressure, the gas-releasing operation may be performed. Under this circumstance, the gas is transferred from the outlet structure 19 to the second outlet chamber 184 through the outlet perforation 182. Consequently, the volume of the second outlet chamber 184 is expanded, and the flexible valve plate 17 corresponding to the second outlet chamber 184 is subjected to the upward curvy deformation. In addition, the valve plate 17 is in close contact with the gas collecting plate 16. Consequently, the valve opening 170 of the valve plate 17 is closed by the gas collecting plate 16. Moreover, the gas collecting plate 16 has the raised structure 167 corresponding to the first outlet chamber 166. Due to the arrangement of the raised structure 167, the flexible valve plate 17 can be bent upwardly more quickly. Moreover, the raised structure 167 can provide a pre-force to achieve a good sealing effect of the valve opening 170. Since the valve opening 170 of the valve plate 17 is contacted with and closed by the raised structure 167, the gas in the second outlet chamber 184 will not be reversely returned to the first outlet chamber 166. Consequently, the efficacy of avoiding gas leakage is enhanced. Moreover, since the gas in the second outlet chamber 184 is transferred to the second pressure-releasing chamber 183 through the communication channel 185, the volume of the second pressure-releasing chamber 183 is expanded. Consequently, the valve plate 17 corresponding to the second pressure-releasing chamber 183 is also subjected to the upward curvy deformation. Since the valve plate 17 is no longer in contact with the first end of the pressure-releasing perforation 181, the pressure-releasing perforation 181 is opened. Under this circumstance, the gas in the second pressure-releasing chamber 183 is outputted through the pressure-releasing perforation 181. Consequently, the pressure of the gas is released. Similarly, due to the convex structure 181a beside the pressure-releasing perforation 181 or the position-limiting structure 188 within the second pressure-releasing chamber 183, the flexible valve plate 17 can be subjected to the upward curvy deformation more quickly. Consequently, the pressure-releasing perforation 181 can be quickly opened. After the gas-releasing operation in one direction is performed, the gas within the equipment which is in communication with the outlet structure 19 is partially or completely exited to the surrounding. Under this circumstance, the pressure of the equipment is reduced.

Figure 7A:
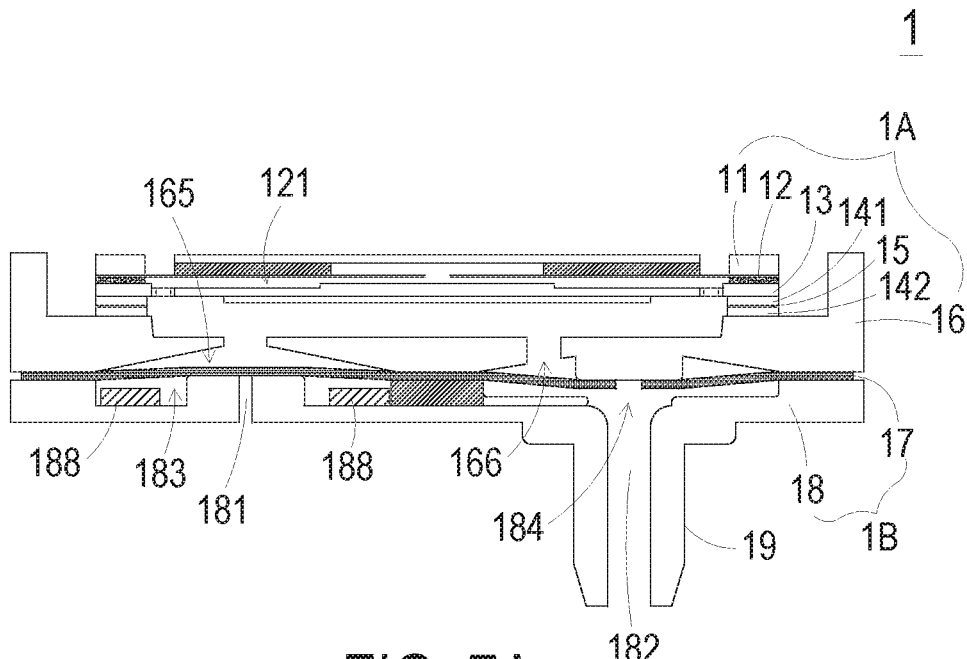
FIGS. 7A to 7E schematically illustrate a gas-collecting operation of the miniature pneumatic device of FIG. 1A.

FIGS. 7A to 7E schematically illustrate the gas-collecting actions of the miniature pneumatic device of FIG. 2A. Please refer to FIGS. 1A, 2A and 7A to 7E. As shown in FIG. 7A, the miniature pneumatic device 1 comprises the miniature fluid control device 1A and the miniature valve device 1B. As mentioned above, the gas inlet plate 11, the resonance plate 12, the piezoelectric actuator 13, the first insulation plate 141, the conducting plate 15, the second insulation plate 142 and the gas collecting plate 16 of the miniature fluid control device 1A are stacked on each other sequentially. There is a gap g0 between the resonance plate 12 and the piezoelectric actuator 13. Moreover, the first chamber 121 is formed between the resonance plate 12 and the piezoelectric actuator 13. The valve plate 17 and the gas outlet plate 18 of the miniature valve device 1B are stacked on each other and disposed under the gas collecting plate 16 of the miniature fluid control device 1A. The gas-collecting chamber 162 is arranged between the gas collecting plate 16 and the piezoelectric actuator 13. The first pressure-releasing chamber 165 and the first outlet chamber 166 are formed in the second surface 161 of the gas collecting plate 16. The second pressure-releasing chamber 183 and the second outlet chamber 184 are formed in the first surface 180 of the gas outlet plate 18. In an embodiment, the operating frequency of the miniature pneumatic device 1 is in the range between 27 kHz and 29.5 kHz, and the operating voltage of the miniature pneumatic device 1 is in the range between ±10V and ±16V. Moreover, due to the arrangements of the plural pressure chambers, the actuation of the piezoelectric actuator 13 and the vibration of the plate 12 and the valve plate 17, the gas can be transferred downwardly.

Figure 7B:
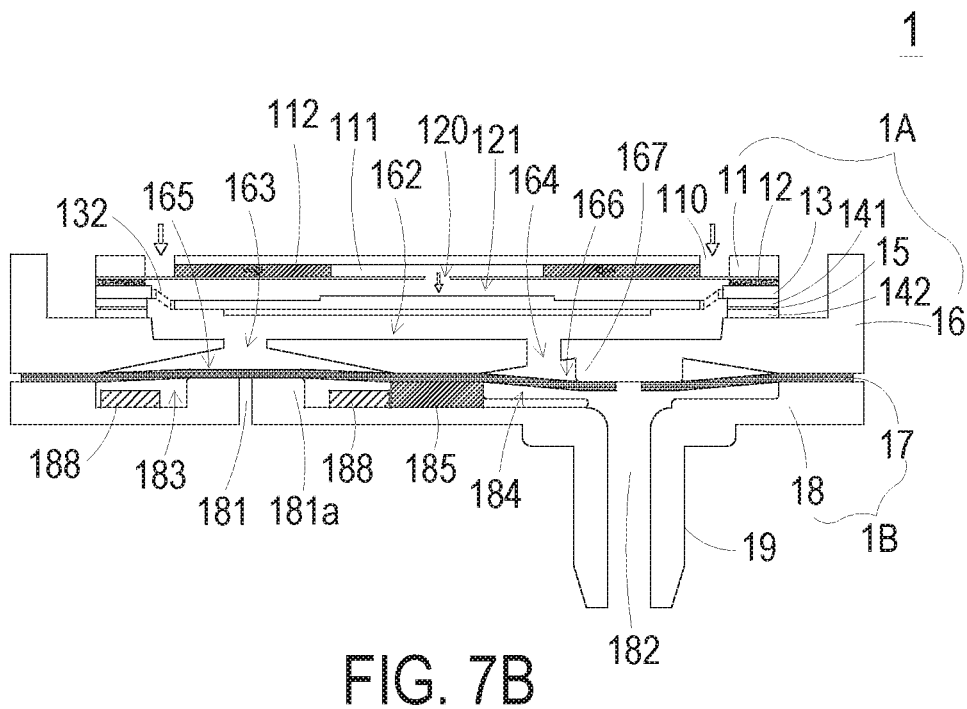

As shown in FIG. 7B, the piezoelectric actuator 13 of the miniature fluid control device 1A is vibrated downwardly in response to the applied voltage. Consequently, the gas is fed into the miniature fluid control device 1A through the at least one inlet 110 of the gas inlet plate 11. The gas is sequentially converged to the central cavity 111 through the at least one convergence channel 112 of the gas inlet plate 11, transferred through the central aperture 120 of the resonance plate 12, and introduced downwardly into the first chamber 121.

Figure 7C:
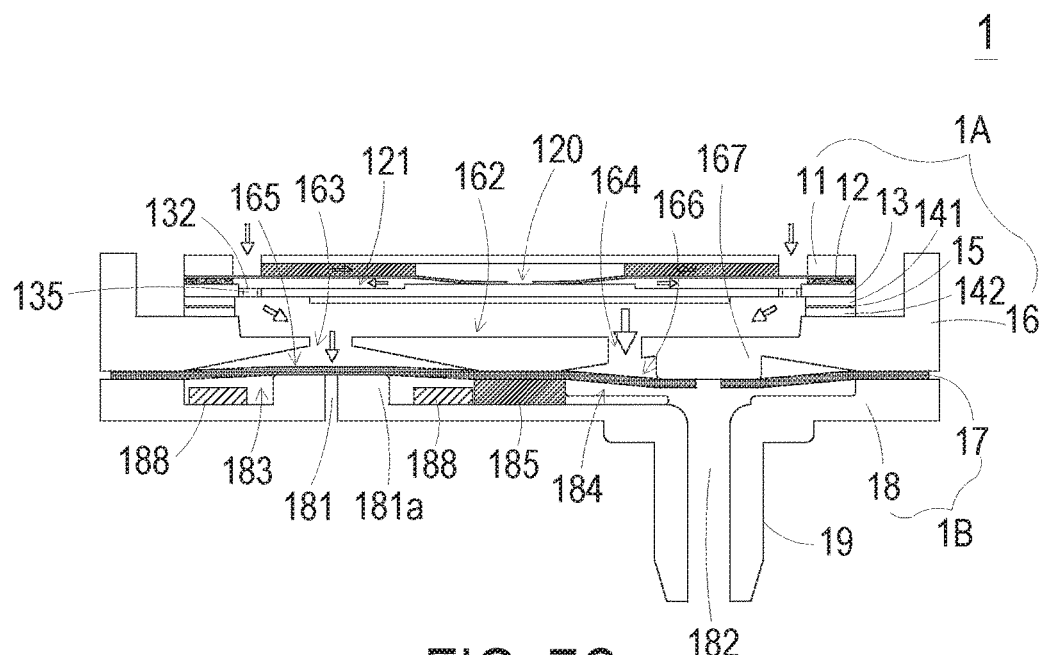

As the piezoelectric actuator 13 is actuated, the resonance of the resonance plate 12 occurs. Consequently, the resonance plate 12 is also vibrated along the vertical direction in the reciprocating manner. As shown in FIG. 7C, the resonance plate 12 is vibrated downwardly and contacted with the bulge 130c of the suspension plate 130 of the piezoelectric actuator 13. Due to the deformation of the resonance plate 12, the volume of the chamber corresponding to the central cavity 111 of the gas inlet plate 11 is expanded but the volume of the first chamber 121 is shrunken. Under this circumstance, the gas is pushed toward peripheral regions of the first chamber 121. Consequently, the gas is transferred downwardly through the vacant space 135 of the piezoelectric actuator 13. Then, the gas is transferred to the gas-collecting chamber 162 between the miniature fluid control device 1A and the miniature valve device 1B. Then, the gas is transferred downwardly to the first pressure-releasing chamber 165 and the first outlet chamber 166 through the first perforation 163 and the second perforation 164, which are in communication with the gas-collecting chamber 162. Consequently, when the resonance plate 12 is vibrated along the vertical direction in the reciprocating manner, the gap g0 between the resonance plate 12 and the piezoelectric actuator 13 is helpful to increase the amplitude of the resonance plate 12. That is, due to the gap g0 between the resonance plate 12 and the piezoelectric actuator 13, the amplitude of the resonance plate 12 is increased when the resonance occurs.

Figure 7D:
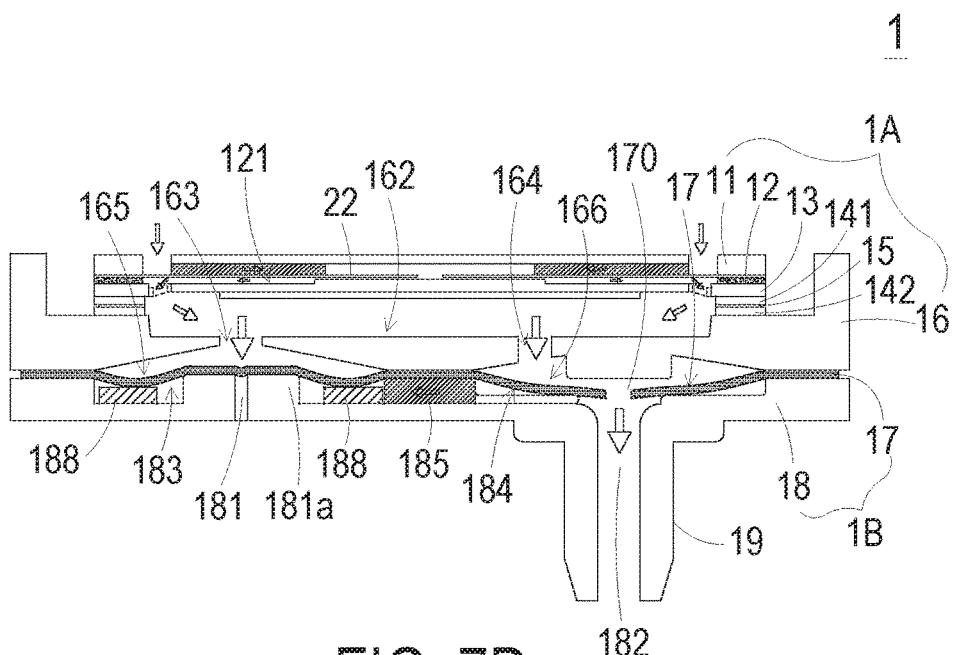

As shown in FIG. 7D, the resonance plate 12 of the miniature fluid control device 1A is returned to its original position, and the piezoelectric actuator 13 is vibrated upwardly in response to the applied voltage. The difference x between the gap g0 and the vibration displacement d of the piezoelectric actuator 13 is given by a formula: $x=g0-d$. A series of tests about the maximum output pressure of the miniature pneumatic device 1 corresponding to different values of x are performed. The operating frequency of the miniature pneumatic device 1 is in the range between 27 kHz and 29.5 kHz, and the operating voltage of the miniature pneumatic device 1 is in the range between ±10V and ±16V. In case that $x=1\sim5$ μm, the maximum output pressure of the miniature pneumatic device 1 is at least 300 mmHg. Consequently, the volume of the first chamber 121 is also shrunken, and the gas is continuously pushed toward peripheral regions of the first chamber 121. Moreover, the gas is continuously transferred to the gas-collecting chamber 162, the first pressure-releasing chamber 165 and the first outlet chamber 166 through the vacant space 135 of the piezoelectric actuator 13. Consequently, the pressure in the first pressure-releasing chamber 165 and the first outlet chamber 166 will be gradually increased. In response to the increased gas pressure, the flexible valve plate 17 is subjected to the downward curvy deformation. Consequently, the valve plate 17 corresponding to the second pressure-releasing chamber 183 is moved downwardly and contacted with the convex structure 181a corresponding to the first end of the pressure-releasing perforation 181. Under this circumstance, the pressure-releasing perforation 181 of the gas outlet plate 18 is closed. In the second outlet chamber 184, the valve opening 170 of the valve plate 17 corresponding to the outlet perforation 182 is opened downwardly. Then, the gas within the second outlet chamber 184 is transferred downwardly to the outlet structure 19 through the outlet perforation 182 and then transferred to the equipment which is in communication with the outlet structure 19. Consequently, the purpose of collecting the gas pressure is achieved.

Figure 7E:
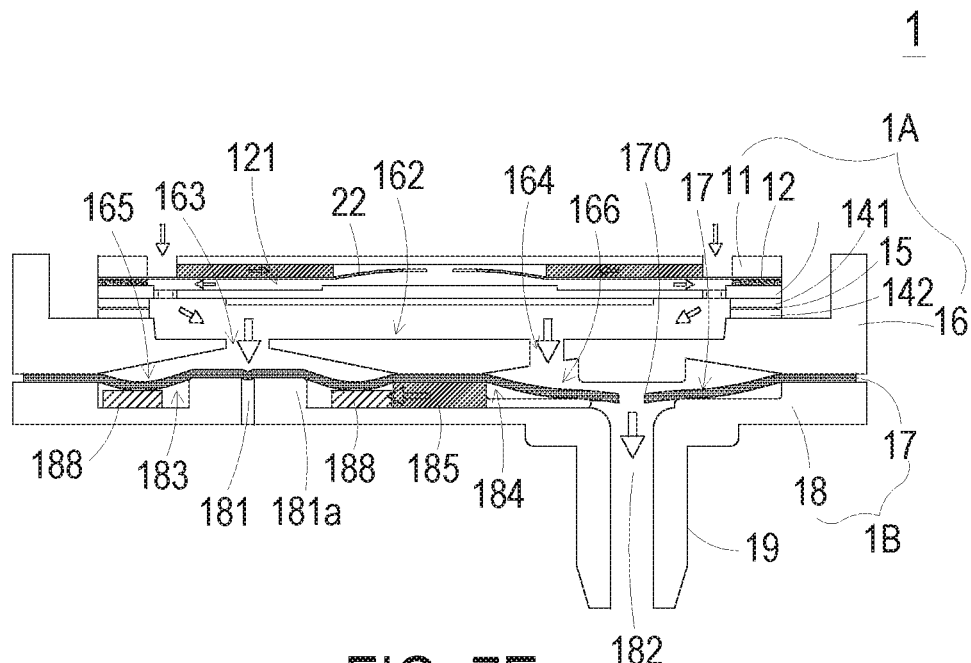

Then, as shown in FIG. 7E, the resonance plate 12 of the miniature fluid control device 1A is vibrated upwardly. Under this circumstance, the gas in the central cavity 111 of the gas inlet plate 11 is transferred to the first chamber 121 through the central aperture 120 of the resonance plate 12, and then the gas is transferred downwardly to the gas collecting plate 16 through the vacant space 135 of the piezoelectric actuator 13. As the gas pressure is continuously increased along the downward direction, the gas is continuously transferred to the gas-collecting chamber 162, the second perforation 164, the first outlet chamber 166, the second outlet chamber 184 and the outlet perforation 182 and then transferred to the equipment which is in communication with the outlet structure 19. In other words, the pressure-collecting operation is triggered by the pressure difference between the ambient pressure and the inner pressure of the equipment.

Figure 8:
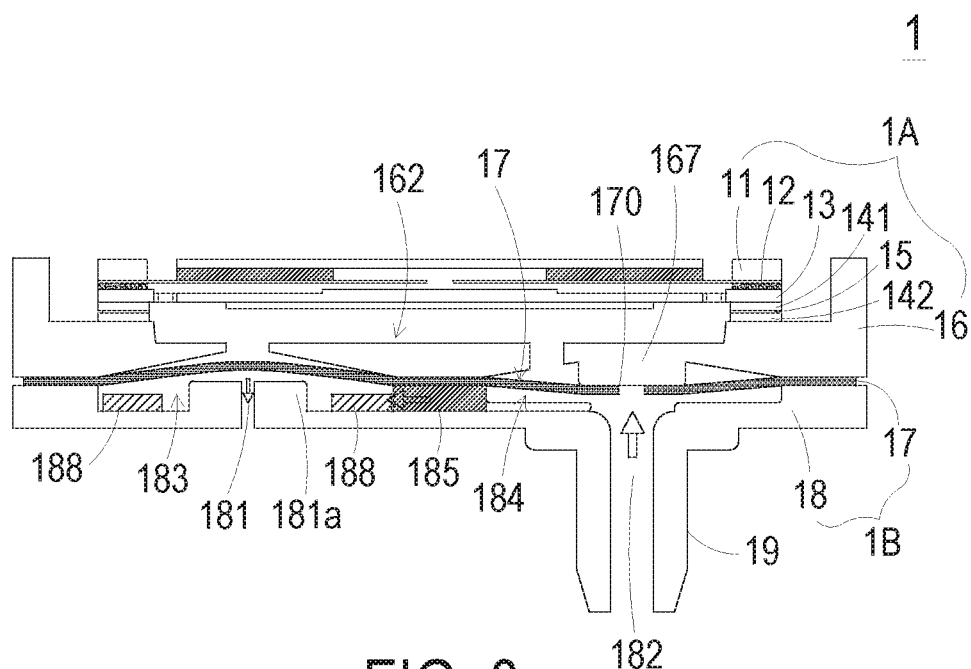
FIG. 8 schematically illustrate the gas-releasing actions or the pressure-reducing actions of the miniature pneumatic device of FIG. 1A.

FIG. 8 schematically illustrate the gas-releasing actions or the pressure-reducing actions of the miniature pneumatic device of FIG. 1A. In case that the inner pressure of the equipment which is in communication with the outlet structure 19 is higher than the ambient air pressure, the gas-releasing operation (or a pressure-reducing operation) may be performed. As mentioned above, the user may adjust the amount of the gas to be fed into the miniature fluid control device 1A, so that the gas is no longer transferred to the gas-collecting chamber 162. Under this circumstance, the gas is transferred from the outlet structure 19 to the second outlet chamber 184 through the outlet perforation 182. Consequently, the volume of the second outlet chamber 184 is expanded, and the flexible valve plate 17 corresponding to the second outlet chamber 184 is bent upwardly. In addition, the valve plate 17 is in close contact with the raised structure 167 corresponding to the first outlet chamber 166. Since the valve opening 170 of the valve plate 17 is closed by the raised structure 167, the gas in the second outlet chamber 184 will not be reversely returned to the first outlet chamber 166. Moreover, the gas in the second outlet chamber 184 is transferred to the second pressure-releasing chamber 183 through the communication channel 185, and then the gas in the second pressure-releasing chamber 183 is transferred to the pressure-releasing perforation 181. Under this circumstance, the gas-releasing operation is performed. After the gas-releasing operation of the miniature valve device 1B in one direction is performed, the gas within the equipment which is in communication with the outlet structure 19 is partially or completely exited to the surrounding. Under this circumstance, the inner pressure of the equipment is reduced.

In the embodiment, the suspension plate 130 is a square suspension plate. As the side length of the square suspension plate 130 is decreased, the area of the suspension plate 130 is reduced. Consequently, the rigidity of the suspension plate 130 is enhanced. In addition, the efficacy of pushing or compressing the gas is increased due to that the volume of the gas channel is reduced. Consequently, the output pressure is increased. Furthermore, the deformation amount of the suspension plate in the horizontal direction is reduced in response to the vertical vibration of the suspension plate, so that the vibration of the suspension plate is maintained in the vertical direction and the piezoelectric actuator is not readily inclined during vibration. Consequently, the collision interference between the piezoelectric actuator and the resonance plate or other component can be reduced. Under this circumstance, the noise is reduced, and the defect rate is reduced. To sum up, as the size of the suspension plate is reduced, the size of the piezoelectric actuator can be correspondingly reduced. Consequently, the performance and maximum output pressure of the miniature pneumatic device are increased, the noise is reduced, and the defect rate is reduced. On the contrary, as the size of the suspension plate is increased, the defect rate of the miniature pneumatic device is increased and the output pressure is reduced.

The suspension plate and the piezoelectric ceramic plate are core elements of the miniature pneumatic device. By reducing the size of the suspension plate and the size of the piezoelectric ceramic plate, the size and weight of the miniature pneumatic device are reduced correspondingly. Consequently, the miniature pneumatic device can be installed in a portable device easily and the applicability of the miniature pneumatic device is not limited.

After the miniature fluid control device 1A and the miniature valve device 1B are combined together, the total thickness of the miniature pneumatic device 1 is in the range between 2 mm and 6 mm. Since the miniature pneumatic device is slim and portable, the miniature pneumatic device is suitably applied to medical equipment or any other appropriate equipment.

From the above descriptions, the present invention provides the miniature pneumatic device. The miniature pneumatic device comprises the miniature fluid control device and the miniature valve device. After the gas is fed into the miniature fluid control device through the inlet, the piezoelectric actuator is actuated. Consequently, a pressure gradient is generated in the fluid channels of the miniature fluid control device and the gas-collecting chamber to facilitate the gas to flow to the miniature valve device at a high speed. Moreover, due to the one-way valve plate of the miniature valve device, the gas is transferred in one direction. Consequently, the pressure of the gas is accumulated to any equipment that is connected with the outlet structure. For performing a gas-releasing operation (or a pressure-reducing operation), the user may adjust the amount of the gas to be fed into the miniature fluid control device, so that the gas is no longer transferred to the gas-collecting chamber. Under this circumstance, the gas is transferred from the outlet structure to the second outlet chamber of the miniature valve device, then transferred to the second pressure-releasing chamber through the communication channel, and finally exited from the pressure-releasing perforation. By the miniature pneumatic device of the present invention, the gas can be quickly transferred while achieving silent efficacy. Moreover, due to the special configurations, the miniature pneumatic device of the present invention has small volume and small thickness. Consequently, the miniature pneumatic device and the miniature fluid control device thereof are portable and applied to medical equipment or any other appropriate equipment.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A miniature fluid control device for a miniature pneumatic device, comprising:
   a gas inlet plate;
   a resonance plate; and
   a piezoelectric actuator comprising a suspension plate, wherein a length of the suspension plate is in a range between 4 mm and 8 mm, a width of the suspension plate is in a range between 4 mm and 8 mm, and a thickness of the suspension plate is in a range between 0.1 mm and 0.4 mm;
   wherein the gas inlet plate, the resonance plate and the piezoelectric actuator are stacked on each other sequentially, and a gap is formed between the resonance plate and the piezoelectric actuator to define a first chamber, wherein when the piezoelectric actuator is driven and after the gas is fed into the miniature fluid control device through the gas inlet plate, the gas is transferred through the resonance plate, introduced into the first chamber, and exited from the miniature fluid control device, and
   wherein the suspension plate further comprises a bulge, the bulge is formed on a surface of the suspension plate that faces the resonance plate, the bulge is a circular convex structure, and a diameter of the bulge is 0.55 times as large as a short side length of the suspension plate.

2. The miniature fluid control device according to claim 1, wherein the gas inlet plate comprises at least one inlet, at least one convergence channel and a central cavity, wherein after the gas is introduced into the at least one convergence channel through the at least one inlet, the gas is guided by the at least one convergence channel and converged to the central cavity, wherein the resonance plate has a central aperture corresponding to the central cavity of the gas inlet plate, and the piezoelectric actuator comprises the suspension plate, an outer frame and a piezoelectric ceramic plate, wherein the suspension plate and the outer frame are connected with each other through at least one bracket, and the piezoelectric ceramic plate is attached on a first surface of the suspension plate.

3. The miniature fluid control device according to claim 2, wherein a length of the piezoelectric ceramic plate is not larger than a length of the suspension plate, the length of the piezoelectric ceramic plate is in a range between 4 mm and 8 mm, a width of the piezoelectric ceramic plate is in a range between 4 mm and 8 mm, a thickness of the piezoelectric ceramic plate is in a range between 0.05 mm to 0.3 mm, and a length/width ratio of the piezoelectric ceramic plate is in a range between 0.5 and 2.

4. The miniature fluid control device according to claim 2, wherein the length of the suspension plate is in a range between 4 mm and 8 mm, the width of the suspension plate is in a range between 4 mm and 8 mm, and the thickness of the suspension plate is 0.27 mm.

5. The miniature fluid control device according to claim 1, further comprising:
   a gas collecting plate with a peripheral wall,
   wherein the gas inlet plate, the resonance plate and the piezoelectric actuator are located within a cavity formed by the peripheral wall.

6. A miniature fluid control device for a miniature pneumatic device, comprising:
   a gas inlet plate comprising at least one inlet, at least one convergence channel and a central cavity, wherein a convergence chamber is defined by the central cavity, wherein after a gas is introduced into the at least one convergence channel through the at least one inlet, the gas is guided by the at least one convergence channel and converged to the convergence chamber;
   a resonance plate having a central aperture corresponding to the convergence chamber of the gas inlet plate; and
   a piezoelectric actuator comprising:
      a suspension plate, wherein a length of the suspension plate is in a range between 4 mm and 8 mm, a width of the suspension plate is in a range between 4 mm and 8 mm, and a thickness of the suspension plate is in a range between 0.1 mm and 0.4 mm;
      an outer frame, wherein the suspension plate and the outer frame are connected with each other through at least one bracket; and
      a piezoelectric ceramic plate, attached on a first surface of the suspension plate, wherein a length of the piezoelectric ceramic plate is not larger than a length of the suspension plate, the length of the piezoelectric ceramic plate is in a range between 4 mm and 8 mm, a width of the piezoelectric ceramic plate is in a range between 4 mm and 8 mm, a thickness of the piezoelectric ceramic plate is in a range between 0.05 mm and 0.3 mm, and a length/width ratio of the piezoelectric ceramic plate is in a range between 0.5 and 2;
   wherein the gas inlet plate, the resonance plate and the piezoelectric actuator are stacked on each other sequentially, and a gap is formed between the resonance plate and the piezoelectric actuator to define a first chamber, wherein when the piezoelectric actuator is driven and after the gas is fed into the miniature fluid control device through the at least one inlet of the gas inlet plate, the gas is sequentially converged to the central cavity through the at least one convergence channel, transferred through the central aperture of the resonance plate, introduced into the first chamber, transferred downwardly through a vacant space between the at least one bracket of the piezoelectric actuator, and exited from the miniature fluid control device, and wherein the suspension plate further comprises a bulge, the bulge is formed on a second surface of the suspension plate, the bulge is a circular convex structure, and a diameter of the bulge is 0.55 times as large as a short side length of the suspension plate.

7. The miniature fluid control device according to claim 6, wherein an operating frequency of the miniature fluid control device is 28 kHz, an operating voltage of the miniature fluid control device is ±15V.

8. The miniature fluid control device according to claim 6, wherein the length of the suspension plate is in a range between 6 mm and 8 mm, the width of the suspension plate is in a range between 6 mm and 8 mm, and the thickness of the suspension plate is 0.27 mm.

9. The miniature fluid control device according to claim 6, wherein the length of the piezoelectric ceramic plate is in a range between 6 mm and 8 mm, the width of the piezoelectric ceramic plate is in a range between 6 mm and 8 mm, and the thickness of the piezoelectric ceramic plate is 0.10 mm.

10. The miniature fluid control device according to claim 6, wherein a thickness of the bulge is in a range between 0.02 mm and 0.08 mm.

11. The miniature fluid control device according to claim 10, wherein the thickness of the bulge is 0.03 mm.

12. The miniature fluid control device according to claim 6, wherein the gas inlet plate is made of stainless steel, and a thickness of the gas inlet plate is in a range between 0.4 mm and 0.6 mm.

13. The miniature fluid control device according to claim 12, wherein the thickness of the gas inlet plate is 0.5 mm.

14. The miniature fluid control device according to claim 6, wherein the resonance plate is made of copper, and a thickness of the resonance plate is in a range between 0.03 mm and 0.08 mm.

15. The miniature fluid control device according to claim 14, wherein the thickness of the resonance plate is 0.05 mm.

16. The miniature fluid control device according to claim 6, wherein the miniature fluid control device further comprises at least one insulation plate and a conducting plate, wherein the at least one insulation plate and the conducting plate stacked on each other and located under the piezoelectric actuator.

17. The miniature fluid control device according to claim 6, wherein the outer frame of the piezoelectric actuator is made of stainless steel, and a thickness of the outer frame is in a range between 0.2 mm and 0.4 mm.

18. The miniature fluid control device according to claim 17, wherein the thickness of the outer frame is 0.3 mm.

19. The miniature fluid control device according to claim 6, wherein two first ends of the bracket are connected with the outer frame, and a second end of the bracket is connected with the suspension plate.

20. The miniature fluid control device according to claim 6, further comprising:
 a gas collecting plate with a peripheral wall,
 wherein the gas inlet plate, the resonance plate and the piezoelectric actuator are located within a cavity formed by the peripheral wall.

* * * * *